(12) United States Patent
Brouillette et al.

(10) Patent No.: US 7,134,933 B2
(45) Date of Patent: Nov. 14, 2006

(54) WAFER THICKNESS CONTROL DURING BACKSIDE GRIND

(75) Inventors: Donald W. Brouillette, St. Albans, VT (US); Thomas G. Ference, Essex Junction, VT (US); Harold G Linde, Richmond, VT (US); Michael S. Hibbs, Westford, VT (US); Ronald L. Mendelson, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/058,537

(22) Filed: Feb. 15, 2005

(65) Prior Publication Data

US 2005/0158889 A1    Jul. 21, 2005

Related U.S. Application Data

(62) Division of application No. 10/012,707, filed on Dec. 7, 2001, now Pat. No. 6,887,126, which is a division of application No. 09/516,445, filed on Feb. 29, 2000, now Pat. No. 6,368,881.

(51) Int. Cl.
*B24B 49/00* (2006.01)
*B24B 51/00* (2006.01)

(52) U.S. Cl. .................................. 451/6; 451/5; 451/8

(58) Field of Classification Search .................. 216/88, 216/89, 90; 356/503, 900, 908; 438/7, 8, 438/14, 16, 691, 693, 977; 451/5, 6, 8, 10, 451/36, 41, 59, 63, 285, 287, 288, 289, 290
See application file for complete search history.

(56) References Cited

U.S. PATENT DOCUMENTS

| | | | |
|---|---|---|---|
| 4,660,980 A * | 4/1987 | Takabayashi et al. | 356/504 |
| 5,127,984 A | 7/1992 | Hua et al. | |
| RE34,425 E | 11/1993 | Schultz | |
| 5,268,065 A | 12/1993 | Grupen-Shemansky | |
| 5,413,941 A | 5/1995 | Koos et al. | |
| 5,433,650 A | 7/1995 | Winebarger | |
| 5,433,651 A | 7/1995 | Lustig et al. | |
| 5,502,564 A | 3/1996 | Ledger | |
| 5,672,091 A | 9/1997 | Takahashi et al. | |
| 5,695,601 A | 12/1997 | Kodera et al. | |
| 5,777,739 A | 7/1998 | Sandhu et al. | |
| 5,856,871 A | 1/1999 | Cabib et al. | |
| 5,891,352 A | 4/1999 | Litvak | |
| 5,909,282 A * | 6/1999 | Kulawiec | 356/504 |
| 5,943,134 A | 8/1999 | Yamaguchi et al. | |
| 6,028,669 A * | 2/2000 | Tzeng | 356/504 |
| 6,071,177 A | 6/2000 | Lin et al. | |

(Continued)

*Primary Examiner*—Timothy V. Eley
(74) *Attorney, Agent, or Firm*—Schmeiser, Olsen & Watts; Anthony Canale

(57) ABSTRACT

A method and apparatus for controlling the thickness of a semiconductor wafer during a backside grinding process are disclosed. The present invention uses optical measurement of the wafer thickness during a backside grinding process to determine the endpoint of the grinding process. Preferred methods entail measuring light transmitted through or reflected by a semiconductor wafer as a function of angle of incidence or of wavelength. This information is then used, through the use of curve fitting techniques or formulas, to determine the thickness of the semiconductor wafer. Furthermore, the present invention may be used to determine if wedging of the semiconductor occurs and, if wedging does occur, to provide leveling information to the thinning apparatus such that a grinding surface can be adjusted to reduce or eliminate wedging.

8 Claims, 18 Drawing Sheets

U.S. PATENT DOCUMENTS

| | | |
|---|---|---|
| 6,111,634 A | 8/2000 | Pecen et al. |
| 6,201,253 B1 | 3/2001 | Allman et al. |
| 6,261,152 B1 | 7/2001 | Aiyer |
| 6,437,868 B1 | 8/2002 | Coult et al. |
| 6,454,630 B1 | 9/2002 | Tolles |
| 6,570,662 B1 * | 5/2003 | Schietinger et al. ........ 356/630 |
| 2002/0192527 A1 * | 12/2002 | Seido et al. .................. 429/34 |
| 2005/0074659 A1 * | 4/2005 | Thomas et al. ............... 429/38 |
| 2005/0105103 A1 * | 5/2005 | Schietinger et al. ........ 356/630 |

* cited by examiner

WAFER THICKNESS CONTROL DURING BACKSIDE GRIND

This application is a divisional of Ser. No. 10/012,707; filed on Dec. 7, 2001 now U.S. Pat. No 6,887,126, which is a divisional of Ser. No. 09/516,445; filed on Feb. 29, 2000 now U.S. Pat. No. 6,368,881.

FIELD OF THE INVENTION

The present invention is in the field of integrated circuits. More particularly, the present invention provides a method and apparatus for accurately controlling the thickness of a semiconductor wafer during a backside grinding process.

BACKGROUND OF THE INVENTION

A semiconductor wafer generally includes a first or "front" side having integrated circuits formed thereon, and a backside comprising a thickness of a bulk semiconductor material (e.g., silicon). Prior to the dicing and packaging of the individual integrated circuit chips formed on the front side of the wafer, the wafer is typically ground on the backside to remove unwanted bulk semiconductor material. The backside grinding process reduces the thickness of the integrated circuit chips, allows smaller packaging, provides better stress performance in laminated packages, and provides other known benefits. Control methods for the backside grinding process typically rely on the mechanical precision of the grinding tool to control the accuracy of the final thickness of the wafer. Although wafers are currently typically ground to a final thickness of about 300 micrometers (microns), the thickness requirement is expected to drop to the 200–250 micron range in the near future, with longer term requirements of 100–150 microns or less. Such thickness requirements will be difficult or impossible to achieve without an accurate feedback mechanism to determine the material thickness during the backside grinding process.

During the backside grinding process, the front side of the wafer is often mounted to a protective tape and placed front side down on a chuck. The backside of the wafer is ground away, stopping at a predetermined depth. The thickness of the protective tape must be taken into account to calculate the final thickness of the wafer. Unfortunately, since the actual tape thickness may vary, the measured thickness of the wafer may also vary. Thus, since the tape thickness affects the final wafer thickness, the tape thickness must be held to very tight tolerances, which results in a very expensive commodity.

Another problem with current methods of backside grinding is determining if the wafer is being formed into a "wedge." Wedging of the wafer can occur if the wafer's surface is not accurately perpendicular to the axis of rotation of the chuck. Wedging can thin one part of the wafer too much, while leaving another part of the wafer too thick. In extreme cases, wedging can actually destroy part of the wafer.

Without a method and apparatus for more accurately reducing wafer thickness without damage to the wafer, the future requirements for wafer thickness will not be met.

SUMMARY OF THE INVENTION

The present invention uses optical measurement of the wafer thickness during a backside grinding process to determine the endpoint of the grinding process. This greatly increases the accuracy of the final thickness of the wafer, thereby allowing, inter alia, thinner integrated circuit chips to be produced. Preferably, for a silicon wafer, an infra-red interferometric wafer thickness measurement is used.

Generally, the present invention provides a method for thinning a semiconductor wafer, comprising the steps of:

removing a portion of a backside of the semiconductor wafer;

optically measuring a thickness of the semiconductor wafer; and stopping the removing step when the measured thickness of the semiconductor wafer reaches a predetermined thickness.

The present invention also provides additional preferred methods for controlling a thickness of a semiconductor wafer during a backside grinding process, the methods entailing measuring light transmitted through or reflected by a semiconductor wafer as a function of angle of incidence or of wavelength. This information is then used, through the use of curve fitting techniques or formulas, to determine the thickness of the semiconductor wafer. Furthermore, the present invention may be used to determine if wedging of the semiconductor occurs and, if wedging does occur, to provide leveling information to the thinning apparatus.

The present invention also provides an apparatus for thinning a semiconductor wafer, comprising a system for removing a portion of a backside of the semiconductor wafer, an optical system for measuring a thickness of the semiconductor wafer, and a control system for halting the removing step when the measured thickness of the semiconductor wafer reaches a predetermined thickness.

BRIEF DESCRIPTION OF THE DRAWINGS

The features of the present invention will best be understood from a detailed description of the invention and a preferred embodiment thereof selected for the purposes of illustration and shown in the accompanying drawings in which.

DETAILED DESCRIPTION OF THE INVENTION

Figure 1:
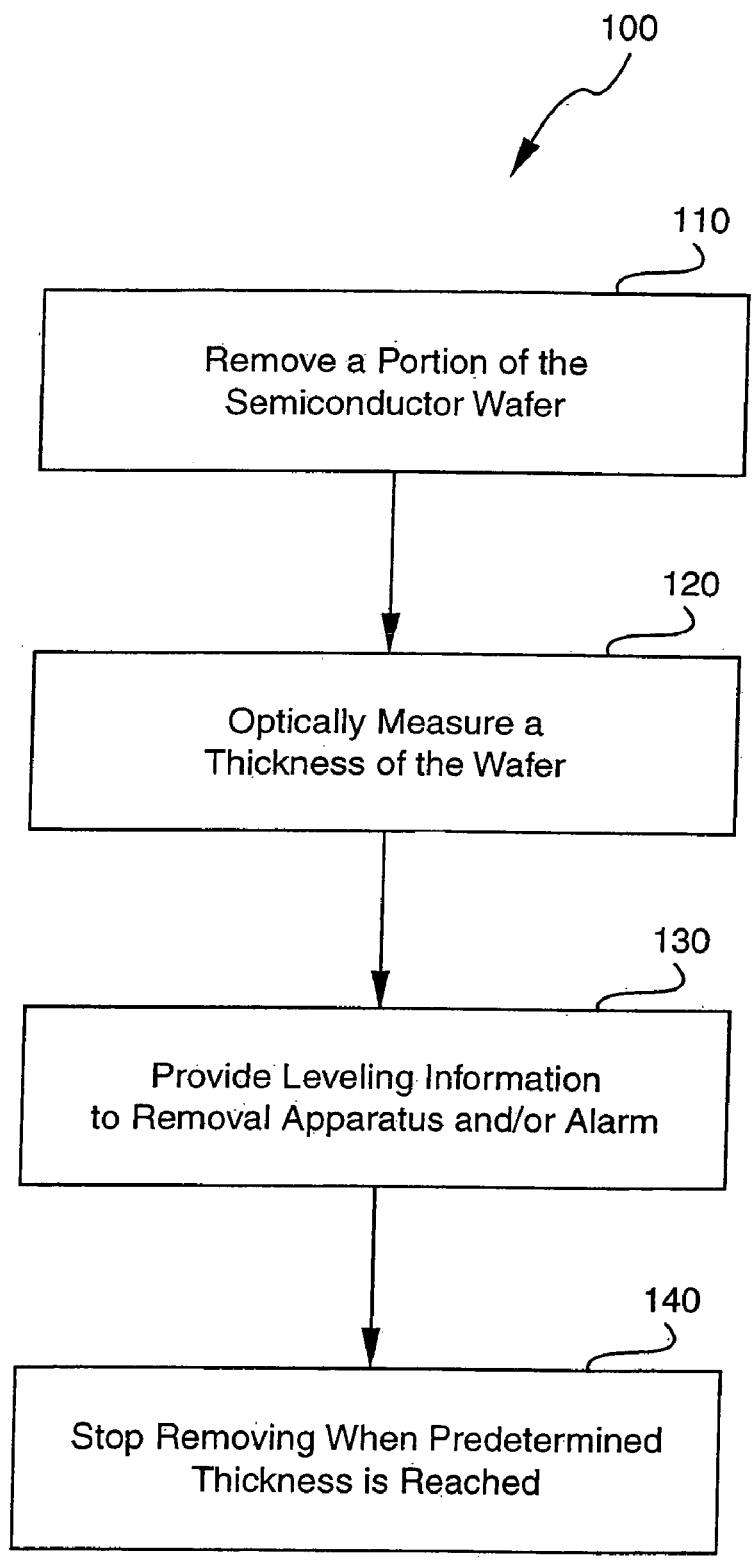
FIG. 1 is a flow chart of a method for thinning a semiconductor wafer according to a preferred embodiment of the present invention.

The features and advantages of the present invention are illustrated in detail in the accompanying drawings, wherein like reference numerals refer to like elements throughout the drawings. Although the drawings are intended to illustrate the present invention, the drawings are not necessarily drawn to scale.

The present invention defines a method for controlling a semiconductor's wafer thickness by examining light reflected by the surface of the semiconductor wafer or passed through the semiconductor wafer. The reflected or transmitted light is measured and analyzed to determine the thickness of the semiconductor wafer. The light is preferably provided by either a single wavelength or multi-wavelength infrared light source. The measurements and analysis are preferably infrared metrology.

Silicon is quite transparent to infrared light in a band from about one micrometer (micron) wavelength to about 6 microns wavelength. Silicon also has a very high index of refraction in this range (approximately 3.43). A thin, planar piece of silicon with two smooth surfaces will act as an optical etalon in this range of wavelengths where silicon is transparent to infrared. This essentially means that light reflected between the two surfaces will optically interfere, creating a series of bright and dark fringes in reflection or transmission as a function of either wavelength or angle of incidence. Essentially, a thin, planar silicon wafer will act as a comb filter to wavelengths or angles of incidence. The silicon wafer will pass some wavelengths of light at certain angles of incidence and reflect other wavelengths of light at other angles of incidence. By analyzing the spacing of bright and dark fringes, an extremely accurate measurement of the silicon thickness can be derived.

In one preferred embodiment of the present invention, an infrared light source (preferably single wavelength) illuminates a semiconductor wafer with diffused light having various angles of incidence to the backside surface of the semiconductor wafer. The semiconductor wafer will pass light at particular angles and reflect light at other angles. The reflected or transmitted light is measured by a segmented detector, each segment of which will measure a certain angle of incidence or a small range of angles of incidence. By analyzing the electrical signals from the segments of the segmented detector, the thickness of the semiconductor wafer at the illumination point may be determined. Generally, this analysis comprises determining the reflectivity or transmission as a function of the angle of incidence, then fitting this curve to ideal curves for each of the thicknesses of the semiconductor wafer. Interpolation may also be performed if the fit is between two of the curves.

In another preferred embodiment of the present invention, an infrared light source (preferably multi-wavelength) is collimated and illuminates a semiconductor wafer. After reflection by or transmission through a semiconductor wafer, a dispersive element is used that disperses different wavelengths of the light into different angles. These different wavelengths of light impinge a segmented detector at different locations along its length. By using the electrical signals from the detector, an analysis of transmission or reflectivity as a function of wavelength may be performed. By either curve fitting, or through formulas, a very fine determination of the semiconductor wafer's thickness may be made.

In another preferred embodiment of the present invention, multi-wavelength light illuminates a beam splitter, which illuminates a movable mirror and a semiconductor wafer. Reflected light from both the semiconductor wafer and the movable mirror again illuminates the beam splitter, which directs a portion of this light onto a non-segmented detector. Alternatively, multi-wavelength light transmitted through a semiconductor wafer illuminates a beam splitter, which illuminates movable and fixed mirrors. Reflected light from both the movable mirror and non-movable mirror again illuminates the beam splitter, which directs a portion of this light onto a non-segmented detector. The moving mirror in both of these embodiments is moved at a fixed velocity over a portion of its length of travel. A Fourier Transform (FT) is performed on the electrical signals from the non-segmented detector to determine the reflectivity or transmission as a function of wavelength. A computer algorithm, called a Fast Fourier Transform (FFT) may be used.

Concerning the terminology used herein, the "topside" of a wafer is the side of the wafer having the deposited process films. The "backside" of the wafer is the side opposite the topside; this side generally is not polished and will not have deposited process films. It should be understood that "transmitted through" or "transmission" means that a detector on one side (e.g., the topside) of a semiconductor wafer will detect light from a light source on the other side (e.g., the backside) of the semiconductor wafer. "Reflected by", "reflectivity" or "reflectance" means that the detector and light source are on the same side of the semiconductor wafer.

It is preferred, when using the embodiments of the current invention that detect light transmitted through the semiconductor wafer, so that an unpatterned section of the semiconductor wafer be illuminated with light. Generally, a small blank area, roughly 1 to 10 millimeters square, should be left uncovered by patterns or semiconductor process films on the surface of the wader to allow the thickness measurement. Alternatively, the edge of the semiconductor may be used for a thickness determination, as this area is normally kept free of semiconductor films. While an opaque area of the semiconductor wafer may be used to make this determination, there may not be enough light transmitted through the semiconductor wafer for an accurate determination of wafer thickness. Opaque areas of the semiconductor wafer are caused by semiconductor films created during processing of the wafer. Note that opaque areas of the semiconductor may still be used for reflectance measurements.

It should also be noted that roughness of the wafer, particularly during backside grinding, will affect the quality of the reflectance or transmission spectrum. However, as show in FIGS. 17 and 18, this effect does not prevent an accurate analysis of the semiconductor wafer thickness.

Turning now to FIG. 1, FIG. 1 shows a preferred method 100 for controlling the thickness of a semiconductor wafer during a backside grinding process. Method 100 is performed during a backside grinding process, generally from the beginning of the backside grind until a predetermined thickness is reached. Method 100 starts, in step 110, when a portion of the backside of a semiconductor is removed. Generally, a grinding wheel abuts the backside of the semiconductor wafer, and the grinding wheel removes a portion of the backside of the semiconductor wafer. The semiconductor wafer's topside is held in a fixed, parallel position to the grinding wheel's surface, while typically the semiconductor wafer rotates about an axis.

In step 120, the step of optically measuring a thickness of the semiconductor wafer is performed. This step, as explained in more detail below, preferably uses infrared interferometry. Any infrared interferometry method known to those skilled in the art may be used with the current invention. Preferred infrared interferometry methods and apparatuses are discussed in more detail below. Using infrared interferometry can yield accuracies in wafer thickness of a small percentage of the thickness. For instance, for a semiconductor wafer thickness of 200 microns, the present invention should be accurate to the range of several microns to the tens of microns.

In step 130, which is optional, leveling information is provided to the removal apparatus. As explained in more detail below, the semiconductor wafer usually rotates about an axis of rotation. The planar grinding surface of a grinding wheel grinds the backside of the semiconductor wafer as the semiconductor wafer rotates. The planar surface of the grinding wheel intersects the axis of rotation at an angle (actually at several angles, as three dimensions are important to describe how the plane of the surface meets the axis of rotation). The planar surface is generally perpendicular to the axis of rotation, meaning that each intersection angle is 90 degrees. By measuring the thickness of the wafer at several angular positions during one rotation of the semiconductor wafer, a determination may be made of several different thicknesses for one rotation of the semiconductor wafer. By comparing these thicknesses, one can determine the amount of "wedging" of the semiconductor. If one side of the semiconductor wafer is thicker than another side, two of the determined thicknesses will be substantially different. Using the information of where along the circumference of the semiconductor wafer the measurements are made and which measurements are different, the angle of the grinding may be changed. Alternatively, an alarm or other indicia could be generated to alert someone to the semiconductor wafer's wedging. The problem causing the wedging could then be observed and fixed.

In step 140, the grinding apparatus is stopped when the semiconductor wafer reaches the predetermined thickness. If more than one circumferential thickness determination is being made (such as made for determining leveling information), there are a number of different methods that may be used to determine the thickness of the wafer. For instance, the smallest thickness determination may solely be used as an indication of when to stop the wafer. Alternatively, an average of the different circumferential thicknesses may be used to determine when to stop the backside grind.

Figure 2:
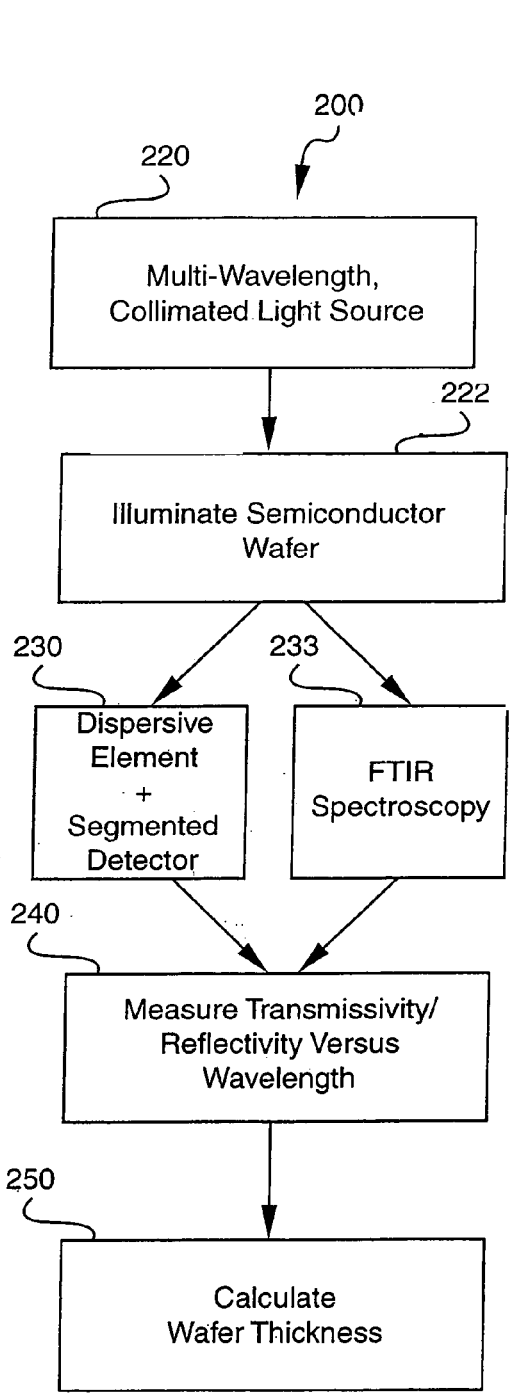
FIG. 2 is a flow chart of a method for optically measuring a thickness of a semiconductor wafer according to a preferred embodiment of the present invention.

Turning now to FIG. 2, step 120 of FIG. 1 is shown in greater detail. Method 200 of FIG. 2 is one preferred method that implements step 120 of FIG. 1. If multiple circumferential determinations of semiconductor wafer thickness will be made, then method 200 will be run multiple times, once per thickness determination. Method 200 begins when a multi-wavelength light source is turned on and collimated (step 220). Alternatively, method 200 begins when the multi-wavelength light source is already turned on, and the thickness measurement is made, for transmission, when an unobstructed portion of the semiconductor wafer is lined up with the multi-wavelength light source. Additionally, a reflectance measurement could be made at a predetermined circumferential location on the semiconductor wafer. When transmitting light through a semiconductor wafer to a detector on the other side of the semiconductor wafer, an unobstructed portion of the semiconductor wafer should be the illuminated portion. This is true because a portion of the semiconductor wafer that is sufficiently opaque will not transmit light or will reduce the light output to an insufficient level. If a "window" is being used, light will generally only travel through the window when the window is aligned with the light source (unless the window is an annulus). Even though the transmitted light will be on the detector for a short time, this short time should easily be sufficient to make an accurate thickness determination.

It should be noted that the steps in method 200 are not necessarily in order. In fact, many of these steps will be performed at about the same time or at exactly the same time. For instance, the semiconductor wafer could be illuminated first, as in transmission, or could be illuminated after passing through a dispersive element, as in reflection.

The semiconductor wafer, in this example, is illuminated with a multi-wavelength light source, the light from which is then collimated. By "multi-wavelength" light source, it is meant that the light source produces a relatively constant amplitude light over a large wavelength range. For instance, an infrared light source usable with the current invention would be a hot metal filament which has a broad range of infrared emission wavelengths.

In step 222, the multi-frequency light source illuminates a semiconductor wafer, either in reflection or in transmission. In step 230, a dispersive element is used to deflect the various wavelengths of light to different angles. The deflection of the various wavelengths occurs after the semiconductor wafer has reflected or transmitted light. Such a dispersive element is preferably a transmissive diffraction grating, phase grating, reflective diffraction grating, or prism, although any apparatus that can disperse infrared light as a function of wavelength may be used in accordance with the current invention. Dispersing various wavelengths of light at different angles allows the semiconductor wafer's selective wavelength filtering to be seen in the dispersed light. Illuminating a segmented detector (step 230) with this dispersed light allows a determination to be made of transmission or reflectivity of the infrared light as a function of wavelength (step 240). From this information, the semiconductor wafer's thickness may be calculated (step 250).

Alternatively, in step 233, the technique of Fourier Transform Infrared (FTIR) spectroscopy could be used to analyze the transmission or reflectance spectrum (step 245). The FTIR analysis apparatus can be arranged to measure the wavelength spectrum of light that is passed through the semiconductor wafer or light that is reflected from the semiconductor wafer. In the former case, light that has passed through the semiconductor wafer is split by a beam splitter, part of the light is sent to a fixed mirror, and part of the light is sent to a movable mirror. After reflection from both mirrors, the two parts of the beam pass through the beam splitter again, which directs some of this light onto a non-segmented detector. In the latter case, light strikes a beam splitter, which directs light onto a movable mirror and the semiconductor wafer. Light from both the movable mirror and the semiconductor wafer reflect onto the beam splitter again, which directs some of this light onto a non-segmented detector. The non-segmented detector is sensitive to a broad range of wavelengths emitted by the multi-wavelength light source.

As the movable mirror is moved at a fixed velocity over a portion of its range of motion, a time-varying intensity modulation of the detected signal occurs. This time-varying signal can be analyzed by a FT (or a computer FFT algorithm) to give the wavelength spectrum of the transmitted or reflected beam of light (step 245). The resulting transmission or reflectivity as a function of wavelength may be analyzed to calculate the wafer thickness (step 250).

Figure 3:
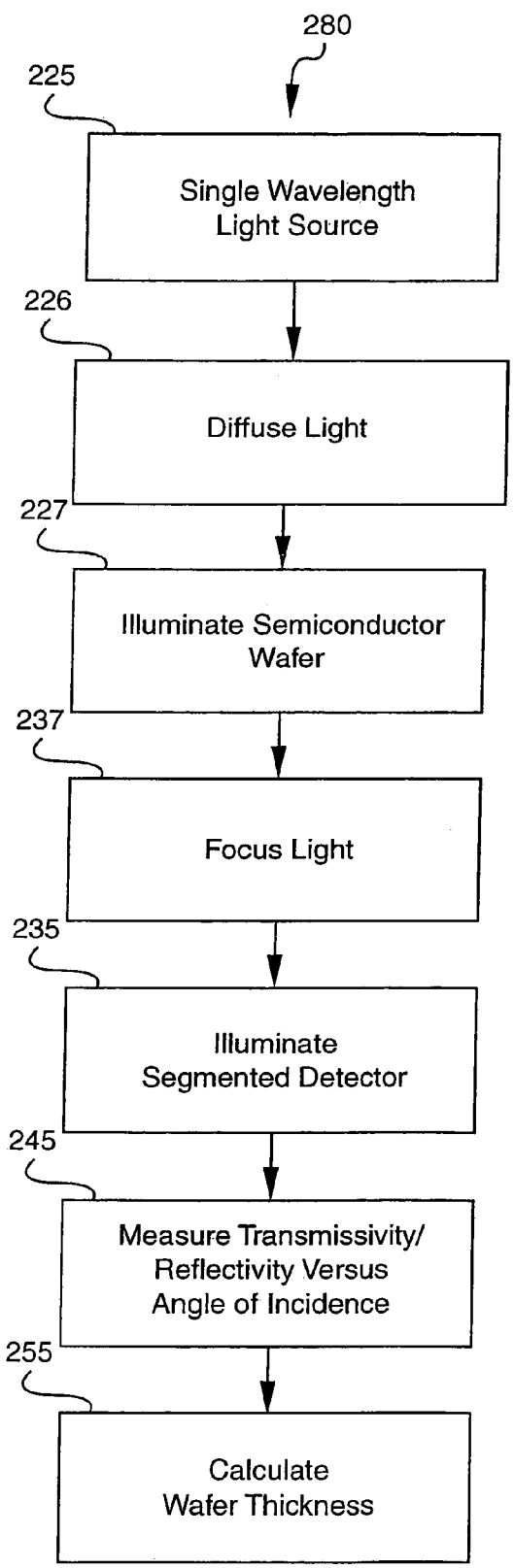
FIG. 3 is another flow chart of a method for optically measuring a thickness of a semiconductor wafer according to a preferred embodiment of the present invention.

Turning now to FIG. 3, step 120 of FIG. 1 is shown in greater detail. Method 280 of FIG. 3 is another preferred method that implements step 120 of FIG. 1. If multiple circumferential determinations of semiconductor wafer thickness will be made, then method 280 will be run multiple times, once per thickness determination. Method 280 begins when a single-wavelength light source is turned on and collimated (step 225). Alternatively, method 280 begins when the single-wavelength light source is already turned on, and the thickness measurement is made, for transmission, when an unobstructed portion of the semiconductor wafer is lined up with the multi-wavelength light source. Additionally, a reflectance measurement could be made at a predetermined circumferential location on the semiconductor wafer. As discussed above, when transmitting light through a semiconductor wafer to a detector on the other side of the semiconductor wafer, an unobstructed portion of the semiconductor wafer should be the illuminated portion.

It should be noted that the steps in method 280 are not necessarily in order. In fact, many of these steps will be performed at about the same time or at exactly the same time. Additionally, by "single wavelength," it is meant that the light source has substantially all of its emission power within a small range of wavelengths. Generally, single wavelength light sources will be lasers, such as a tunable infrared diode laser having a peak wavelength that is adjustable from 3 microns (microns) to 12 microns and a range of wavelengths of about one picometer about the selected peak wavelength.

In step 226, a diffuser is used to diffuse the light. The diffused light illuminates the semiconductor wafer (step 227), with each light ray having a particular angle of incidence to the semiconductor wafer. The semiconductor wafer acts as a filter, filtering out particular angles of incidence while allowing other angles of incidence to pass. Light reflected by or transmitted through the semiconductor wafer is focused (step 237) and then illuminates a segmented detector (step 235). Focusing step 237 is important, as it takes diffuse light and focuses light from individual angles (or a small range of angles) onto one segment of the segmented detector. Without focusing step 237, light from too many different angles will hit each segment of the segmented detector, leading to invalid results. Analyzing data from the segmented detector allows one to determine the reflectivity or transmission as a function of angle of incidence (step 245). From this information, one can calculate the semiconductor wafer's thickness (step 255).

Figure 4:
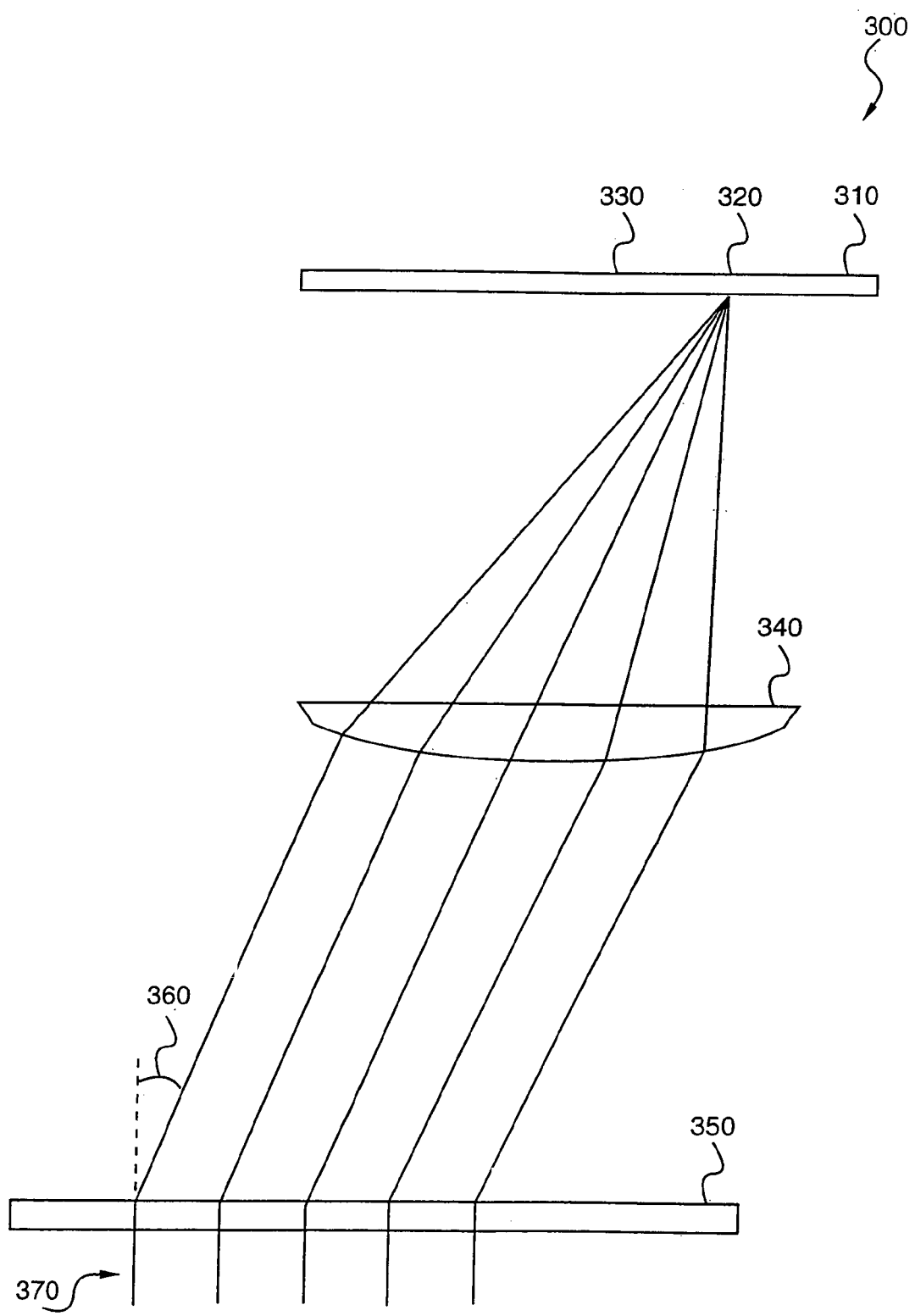
FIG. 4 is an illustration of the principles of operation for one preferred embodiment of the present invention.

Now that the preferred methods of performing the embodiments of the current invention have been described, the preferred apparatuses of the current invention will be described. Referring now to FIG. 4, this figure shows one principle of operation used when determining reflectivity or transmission as a function of wavelength.

In FIG. 4, collimated light 370 impinges on a dispersive element 350. In this example, collimated light 370 illustrates one wavelength of an infrared light source. Also, the single wavelength has already passed through the semiconductor wafer at a point preceding dispersive element 350. The dispersive element 350 in this example is a transmissive diffraction grating. Diffraction grating 350 diffracts different wavelengths of light into different angles. For instance, the example wavelength 370 of infrared light is diffracted through angle 360. A different wavelength of infrared light (not shown) would be diffracted at a different angle. The single wavelength light diffracts to and through lens 340, which could be made of silicon or any other material that is transparent in the infrared. Lens 340 focuses this light onto a point 320 on a segmented detector 310.

A different wavelength of light would diffract through a different angle and would impinge segmented detector 310 at a point separate from 320. In the example of FIG. 4, point 330 represents the location along the segmented detector where a light ray of a different wavelength would impinge. The different path through the lens is not shown for clarity. Similarly, other light rays having different wavelengths would impinge the segmented detector 310 at even more locations (not shown) along its length. Because the semiconductor wafer will reflect certain wavelengths of light while letting other wavelengths pass, segmented detector 310 will have a series of light and dark areas along its length. By analyzing the data from the segmented detector, a determination of reflectivity or transmission as a function of wavelength may be made. In reality, there will be a series of light and dark rings or annuli produced by diffraction element 350 and lens 340. It is only necessary, however, to determine the intensity of the light along one axis of the segmented detector.

In the specific instance where diffraction element 350 is a transmissive diffraction grating, the transmissive diffraction grating is made of parallel, opaque lines on the transparent substrate, each parallel, opaque line separated by another parallel line by a distance. The relationship for angle 360 is that angle 360 may be derived from the arcsin of an integer times the wavelength divided by the distance between the parallel, opaque lines. The transverse position (such as position 320 or 330) on segmented detector 310 where the light comes to a focus can be used to determine the diffraction angle 360 for any wavelength. As is known to those skilled in the art, the transverse position may be determined by the geometry of system 300 and the focal length of lens 340. Once the distance between the parallel, opaque lines on diffraction element 350 and the diffraction angle 360 are known, it is a simple exercise to determine the wavelength of light that impinges any portion of segmented detector 310.

Figure 5:
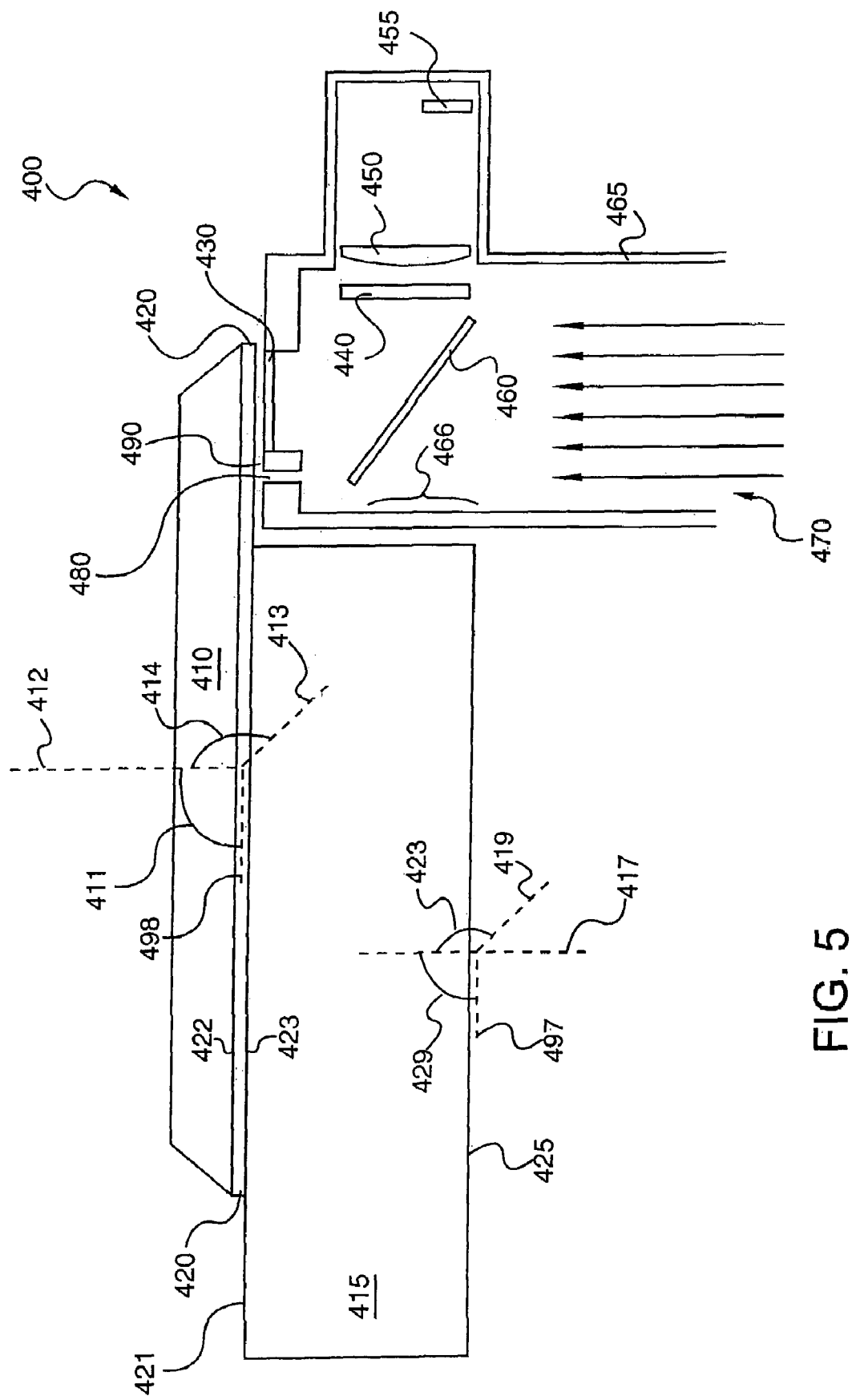
FIG. 5 illustrates a preferred apparatus for thinning a semiconductor wafer that measures light reflected by a semiconductor wafer as a function of wavelength.

Turning now to FIG. 5, an apparatus that thins a semiconductor wafer and that uses the principle of FIG. 4 is shown. Backside grinding apparatus 400 comprises a backing plate 410, a grinding wheel 415, an infrared (IR) window 430, a splitter 460, a dispersive element 440, an IR lens 450, a segmented detector 455, and a housing 465. Collimated, multi-wavelength light 470 illuminates splitter 460, which directs substantially half of the light to the semiconductor wafer 420. The light reflected from the wafer returns to the splitter 460, and half of the remaining light is directed to the dispersive element 440. Note that splitter 460 will direct part of the multi-wavelength light 470 into housing 465 at location 466. It is preferred that housing 465 be, of a material that does not reflect infrared light. If this is not the case, then infrared absorbent material or another "beam-stop" (such as providing location 466 with a rough surface) should be placed at location 466 to prevent or reduce reflected infrared light.

Housing 465 is preferably water proof and has a water injection port 480. Water injection port 480 will generally be connected to a water tube (not shown). Water injected into port 480 will run through channel 490 and remove grinding debris. Furthermore, this water will help to couple light between the IR window 430 and semiconductor wafer 420.

Semiconductor wafer 420 is placed between backing plate 410 and grinding wheel 415. Semiconductor wafer 420 has a topside 422, which has the processing films, and backside 423. Semiconductor wafer 420 rotates, along with backing plate 410, about axis of rotation 412. Backing plate 410 holds semiconductor wafer 420 fixed in vertical and horizontal planes. This allows the surface 421 of grinding wheel 415 to grind the backside 423 of semiconductor wafer 420 yet also allows the grinding wheel to be adjusted to reduce or prevent wedging.

Grinding wheel 415 rotates about its own rotational axis 417. Surface 421 of grinding wheel 415 is planar and intersects axis 413 at an angle. Because the surface 421 can move in three dimensions, this "angle" may be further divided into two angles corresponding to two axes in the plane of the surface of the grinding wheel. For instance, in the example of FIG. 5, angle 411 occurs between axis 498 (parallel to surface 421) and axis 412. Similarly, angle 414 occurs between axis 413 (parallel to surface 421 of the grinding wheel, but 90 degrees from axis 498) and axis 412. Axes 413, 412 and 498 may be thought of as the familiar x,y,z coordinate system. By modifying the grinding wheel's position about axes 497 and 419, the amount of wedging of the semiconductor may be changed. Alternatively, by modifying the chuck's 410 position about axes 413 and 498, the amount of wedging of the semiconductor may be changed.

Note that this is a relatively simple explanation of what can actually be a complex analysis. For instance, if chuck 410 meets the grinding wheel 415 such that grinding wheel 415 grinds more of the outer circumference of semiconductor wafer 420, then an annulus-type wedge could be created. This may be hard to detect using the apparatus of FIG. 5. Moreover, it is possible that chuck 410 could wobble as it rotates, and such a wobble might not be corrected by correcting the grinding wheel's position about axes 497 and 419 or corrected by correcting the chuck's position about axes 413 and 498. Thus, it is preferred that any detection of wedging sound an alarm or cause other indicia that will alert personnel to the wedging of the semiconductor wafer. While it may be possible to modify angles 411 or 414 of chuck 410 during the grinding operation, these modifications may be somewhat complex.

Splitter 460 directs collimated light 470 through IR window 430 and onto the backside surface 423 of semiconductor wafer 420. Some of this light will be reflected from backside surface 423 to the splitter 460, which then directs the light onto dispersive element 440. Some of the light will pass through the semiconductor wafer and reflect off of topside surface 422 of semiconductor wafer 420. Alternatively, semiconductor films on the topside surface or in the substrate of the semiconductor wafer will reflect the light.

Dispersive element 440, as explained with reference to FIG. 4, disperses different wavelengths at different angles. The semiconductor wafer already has passed some wavelengths, while reflecting other wavelengths. The passed wavelengths essentially are absorbed (or at least not reflected by) chuck 410. Again, if the surface of chuck 410 is reflective to infrared light, it is preferred that a beam stop be used on the surface of chuck 410. In general, the protective tape used to hold the semiconductor wafer onto the chuck 410 should be sufficiently rough to absorb most infrared light. The dispersed light leaving dispersive element 440 is focused by lens 450 onto segmented detector 455. Because each segment of segmented detector 455 should receive light from a narrow range of wavelengths, the reflectivity of the semiconductor wafer as a function of wavelength may be determined. Note that each segment could receive a small range of wavelengths, depending on the dispersive element used, the detector and the number and size of its segments, the focal length of lens 450 and other factors. If more segments are used, the determination of reflectivity as a function of wavelength will be more accurate.

Figure 6:
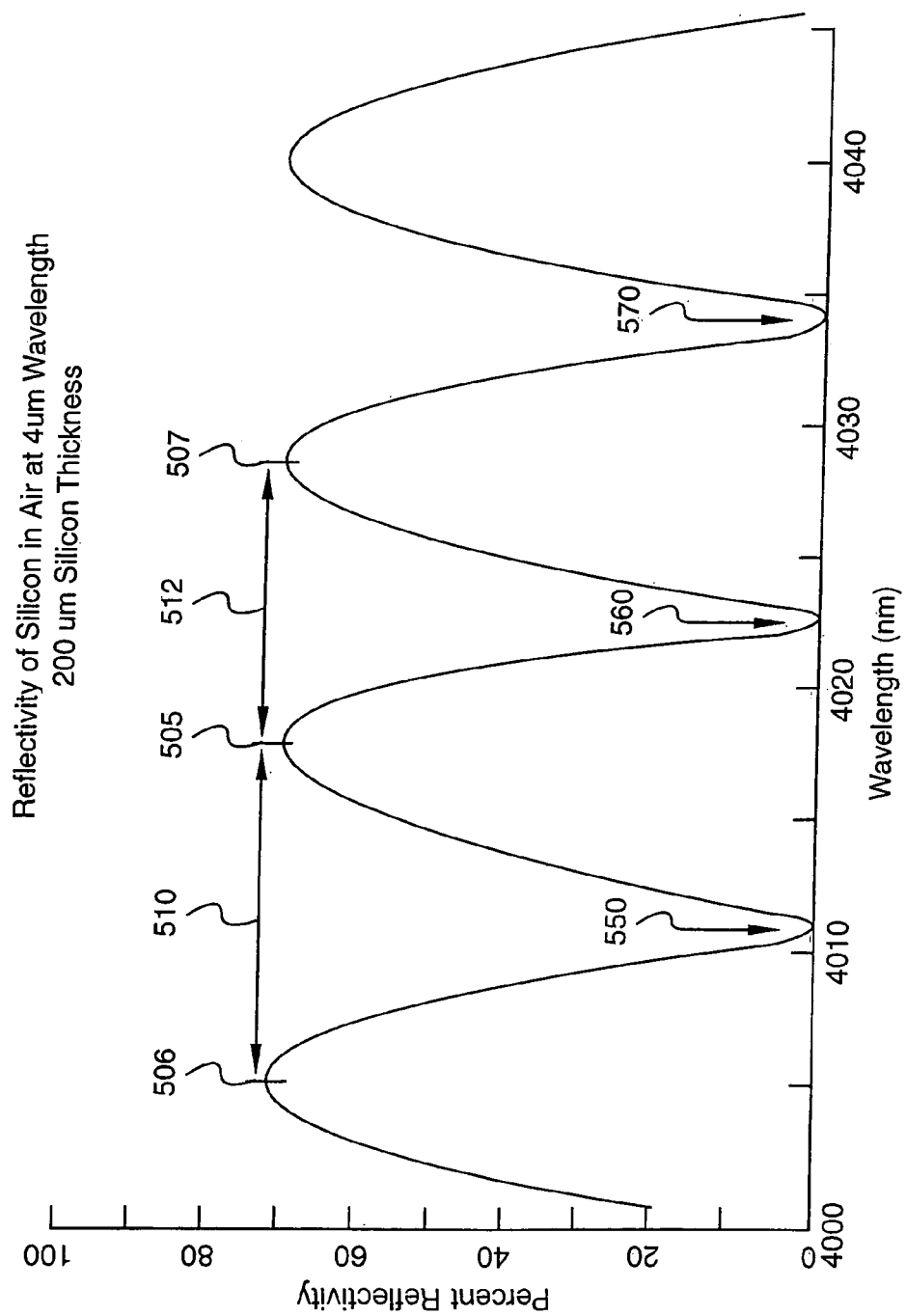
FIG. 6 illustrates an example of reflectivity of light reflected by a semiconductor wafer as measured by the preferred apparatus of FIG. 5 and FIG. 11.

Referring now to FIG. 6, a mathematically calculated graph of reflectivity of a silicon wafer in air is shown. FIG. 6 shows reflectivity (in percent, as a portion of total power that impinges the semiconductor wafer and that could be reflected) as a function of wavelength, for wavelengths that begin at 4 microns and end at about 4.045 microns. This graph shows the theoretical results for a semiconductor wafer that is 200 microns thick. The peaks 506, 505, and 507 in reflectivity occur at points where the semiconductor wafer reflects more of these particular wavelengths. Distances 510 and 512 should be approximately the same and either distance may be used to calculate the thickness of the semiconductor wafer in the following manner. If the distance, in wavelength, between two adjacent peaks is $\Delta\lambda$, and the average of the two wavelengths (such as the wavelengths corresponding to peaks 506 and 505) is $\lambda$, then the thickness of the silicon wafer is $\lambda^2/(2n\Delta\lambda)$, where n is the index of refraction of silicon at the average wavelength $\lambda$. It can be seen from the previous equation that decreasing the semiconductor wafer thickness will cause an increase in the distance $\lambda$ between any two peaks.

While it is preferred that the average of the two wavelengths be used in the denominator of the preceding equation, this is not necessary. For instance, if the average wavelength corresponding to peaks 506 and 505 is used (about 4.012 microns), the determined thickness would be about 196 microns (using n=3.43). If the wavelength corresponding to peak 506 is used (about 4.005 microns), the determined thickness would be about 195 microns. In addition, troughs 550, 560, and 570 may also be used to determine the semiconductor wafer thickness using the prior formula.

Alternatively, a curve-fitting technique may be used to determine the semiconductor wafer thickness. In this analysis, the determined data are compared against a number of wavelength spectra. These wavelength spectra could be mathematically determined or empirically determined. If mathematically determined wavelength spectra are used, these could be stored and retrieved, or calculated in real time. Both of these methods may incorporate interpolation. For example, if empirically determined curves are stored for 100 microns thickness and 150 microns thickness, but the curve for 125 microns is not stored and the semiconductor wafer being measured is 125 microns thick, the two empirically determined curves may be interpolated to produce a curve corresponding to 125 microns of semiconductor wafer thickness.

Curve fitting is well known to those skilled in the art. The preferred curve fitting best suited to reflectivity (and transmission) as a function of wavelength is curve fitting that determines the separation of the peaks 507, 506, and 505 and the troughs 550, 560 and 570. As discussed with reference to FIGS. 17 and 18, roughness of the surface will affect the dynamic range of FIG. 6, but should not affect the location of the peaks and troughs.

In reality, fitting a curve to reflectivity (or transmission) curves as a function of wavelength will be slightly harder than what has been described. As the semiconductor wafer is thinned, the phase of the spectrum curve (shown, for instance, in FIG. 6) would begin to change. This would cause the curve to move to the left. After it moves a certain distance, the peaks would then come back to where they started, only they would be a little closer together because the wafer was thinned a little. As the semiconductor wafer continued to be ground, the whole spectrum would continue to shift.

Even though the phase of the curve changes, the distances between wavelengths for peaks (or troughs) may still be used to determine the semiconductor wafer's thickness. The wavelength formula is most preferred, as this is relatively easy and fast. If curve fitting is used, the designer of the system should determine which of mathematical or empirical wavelength spectra should be used.

Figure 7:
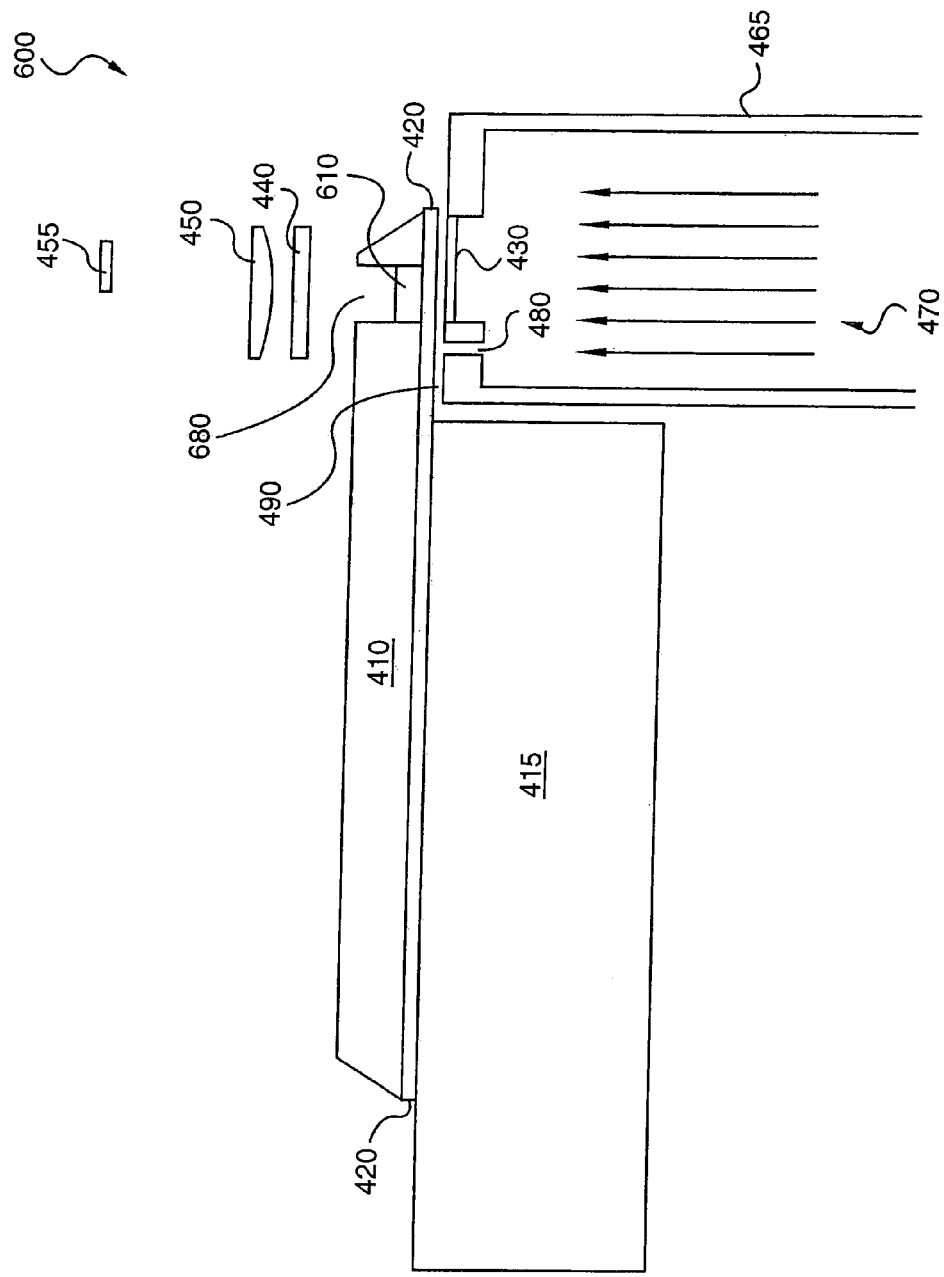
FIG. 7 illustrates a preferred apparatus for thinning a semiconductor wafer that measures light transmitted through a semiconductor wafer as a function of wavelength.

Referring now to FIG. 7, an apparatus that thins a semiconductor wafer and that uses the principle of FIG. 4 is shown. Backside grinding apparatus 600 comprises a backing plate 410, a grinding wheel 415, infrared (IR) windows 430 and 610, a dispersive element 440, an IR lens 450, a segmented detector 455, and a housing 465. Collimated, multi-wavelength light 470 illuminates window 430, which allows light onto the semiconductor wafer 420. Light travels through an area of semiconductor wafer 420 that preferably has no semiconductor films on it. This area could be a window kept free of semiconductor films or the edge of the semiconductor wafer, which is normally kept free of semiconductor films. While opaque areas of the semiconductor may be used in transmission embodiments of the current invention, opaque areas may reduce the dynamic range of the transmission wavelength spectrum to an amount that makes it hard to accurately determine the semiconductor wafer thickness. Additionally, the opaque areas may cause other deleterious affects such as prismatic effects or diffraction effects (most areas will have closely spaced opaque areas).

Additionally, unless passage 680 is an annulus, passage 680 will only be aligned with window 430 once per revolution of the semiconductor wafer 420 and backing plate 410. If additional thickness measurements are needed, such as for a wedging determination, additional passages may be cut into the backing plate at different circumferential points.

Infrared light travels through the semiconductor wafer, and passes through IR window 610, which is located in a passage 680 cut into backing plate 410. This light then passes through dispersive element 440. Lens 450 focuses the diffracted light onto segmented detector 455. The other elements of backside grinding apparatus have already been discussed in reference to FIG. 5.

Figure 8:
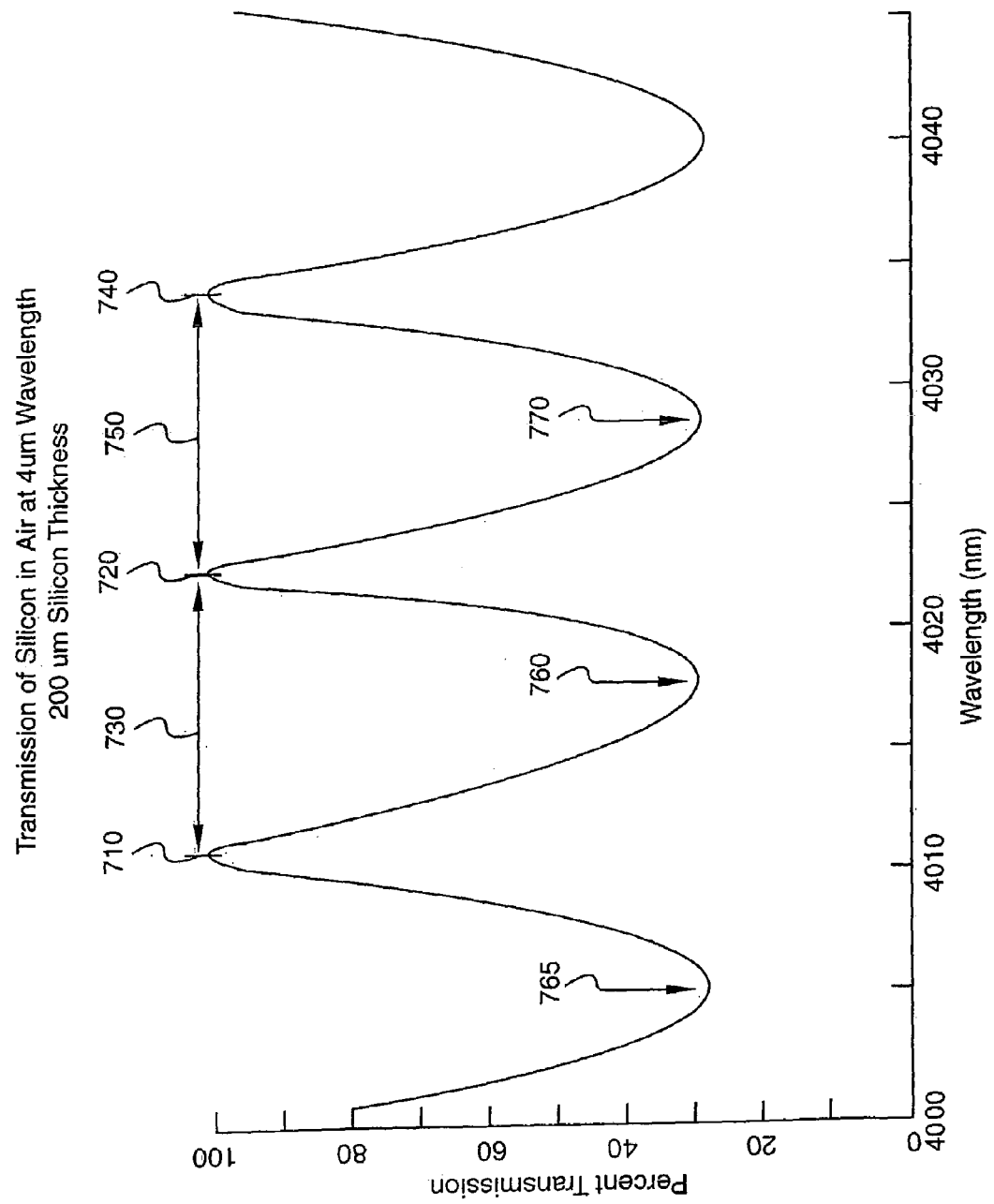
FIG. 8 illustrates an example of transmission of light passing through a semiconductor wafer as measured by the preferred apparatus of FIG. 8 and FIG. 10.

Referring now to FIG. 8, a resultant graph of transmission as a function of wavelength is shown. This figure is a theoretical graph of the transmission of infrared light through a silicon semiconductor wafer that is 200 microns thick. Peaks 710, 720, and 740 correspond to troughs 550, 560 and 570, respectively, of FIG. 6. Troughs 765, 760, and 700 correspond to peaks 506, 505, and 507, respectively of FIG. 6. The formula and curve fitting analyses discussed in reference to FIG. 6 may also be performed here. For instance, distance 730 or 750 may be used, along with the previous formula, to determine the semiconductor wafer thickness. Again, either troughs or peaks may be used in that formula.

The detriment to this apparatus is that the backing plate 410 must be drilled to provide for passage 680. Because of this, the apparatus of FIG. 5, which does not need to have the backing plate drilled, is preferred.

Figure 9:
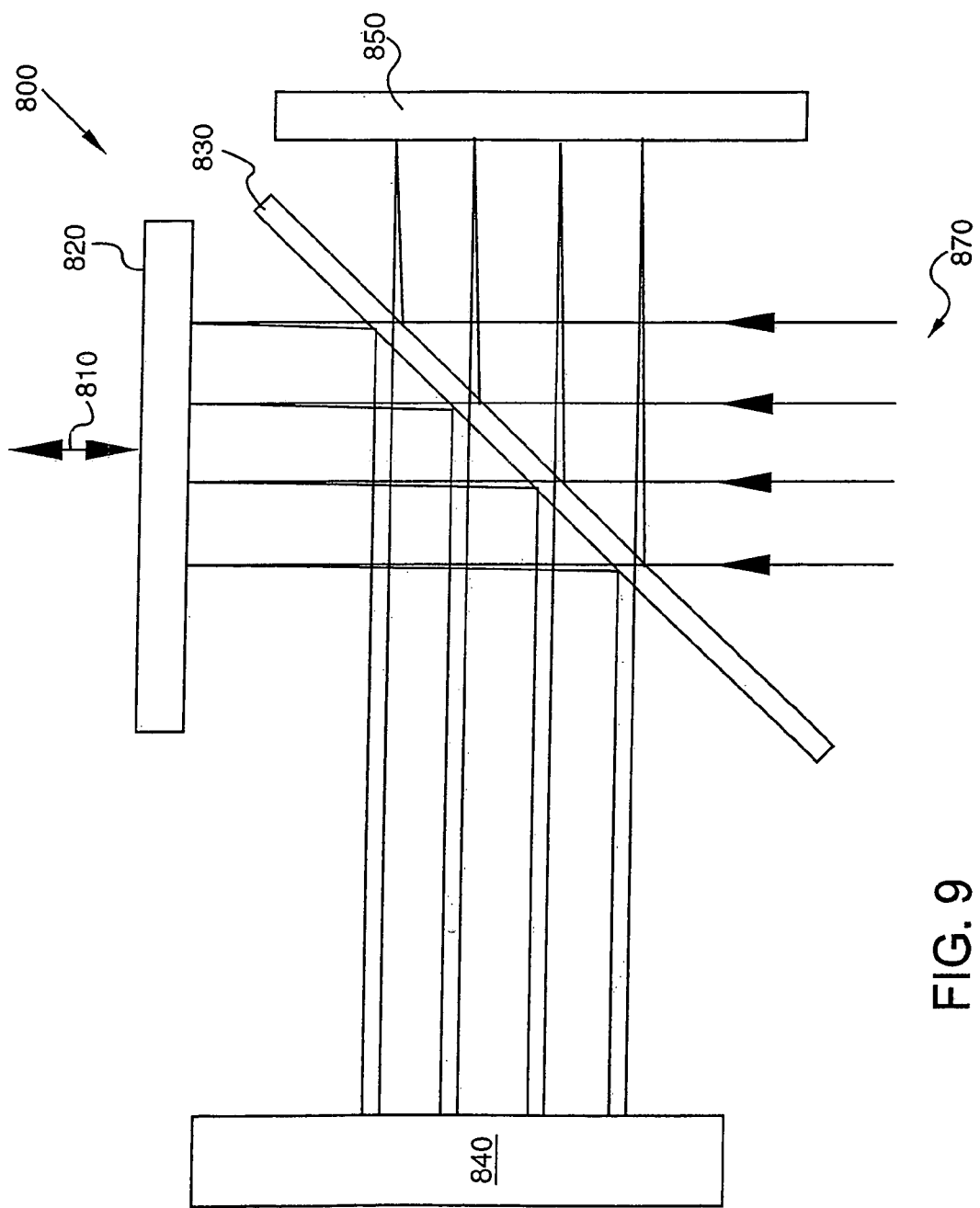
FIG. 9 is an illustration of the principles of operation for one preferred embodiment of the present invention.

Turning now to FIG. 9, another principle of operation that may be used when determining reflectivity or transmission as a function of wavelength is shown. In this embodiment, infrared light 870 illuminates an IR splitter 830. In this example, infrared light 870 has already passed through a semiconductor wafer (not shown). IR splitter 830 directs light to fixed mirror 850, which reflects light back through the splitter and onto a non-segmented detector 840. Splitter 830 also directs light onto a movable mirror 820. Movable mirror 820 has a range of motion, only a portion of which is shown in FIG. 9. Movable mirror 820 is moved along axis 810 at a fixed velocity through a portion of its range of motion. Light illuminating movable mirror 820 is reflected back to splitter 830, which reflects a portion of the light onto non-segmented detector 840.

The velocity of the mirror will generally run between about 0.15 to 5 centimeters per second. This allows frequency counters to be used that have speeds between 750 hertz and 25 kilohertz, assuming a wavelength of 4 microns. Faster velocities simply mean that better frequency counters must be used.

If the infrared light 870 had only a single wavelength, non-segmented detector 840 would detect an oscillating signal of frequency equal to two times the velocity of the mirror divided by the wavelength of the light being used. When a multi-wavelength light source is used, non-segmented detector 840 will receive all frequencies corresponding to all the various wavelengths of the light source. To determine a wavelength spectrum, the electrical output of the non-segmented detector 840 can be sampled at a certain frequency. This data can be collected and analyzed in a few seconds or even a fraction of a second. A Fourier Transform (FT) on this data will determine the frequency content of the data. Each frequency can be converted to wavelength by using the formula $\lambda = 2 \, v/f$, which is the previously discussed formula. It should be noted that velocity in this equation is a magnitude and is not signed.

Using this formula will provide a reflectivity or transmission as a function of wavelength graph like the graphs shown in FIGS. 6 and 8, respectively. The methods, for determining the semiconductor wafer thickness, discussed in reference to these figures, are also appropriate here.

Figure 10:
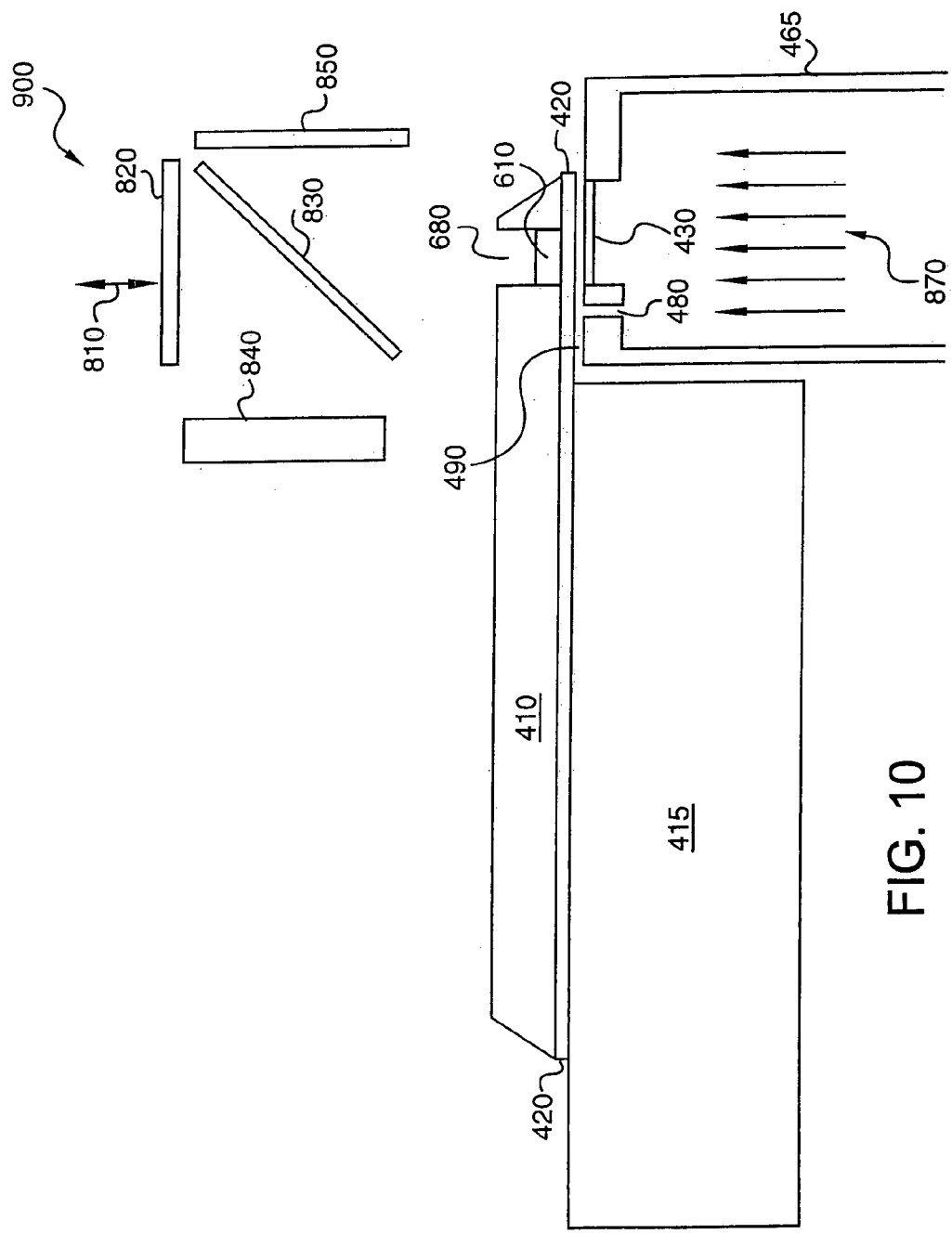
FIG. 10 illustrates a preferred apparatus for thinning a semiconductor wafer that measures light transmitted through a semiconductor wafer as a function of wavelength.

Referring now to FIG. 10, an apparatus that thins a semiconductor wafer and that uses the principle of FIG. 9 is shown. Backside grinding apparatus 900 comprises a backing plate 410, a grinding wheel 415, infrared (IR) windows 430 and 610, a splitter 830, a movable mirror 820 that is moved along axis 810, a fixed mirror 850, a non-segmented detector 840, and a housing 465. Multiple wavelength infrared light 870 illuminates window 430, which allows light onto the semiconductor wafer 420. As previously discussed, this transmittance determination is preferably made through a portion of the semiconductor wafer having no process films on it. Additionally, unless passage 680 is an annulus, passage 680 will only be aligned with the splitter 830 and window 430 once per revolution of the semiconductor wafer 420 and backing plate 410. The rotational speed of the backing plate determines the frequency at which data from the non-segmented detector may be determined. Note that the rotational speed of the backing plate also determines when the mirror moves: the mirror should be at a constant velocity during the time when IR window 680 is aligned with IR window 430. If the velocity is not constant over this range, then the frequency determinations will not have constant velocity and will be not be correct. If additional thickness measurements are needed, such as for a wedging determination, additional passages may be cut into the backing plate at different circumferential points.

The infrared light 870 transmits through semiconductor wafer 420 and passes through IR window 610, which occupies passage 680. IR splitter 830 directs light onto movable mirror 820, fixed mirror 850, and non-segmented detector 840. Movable mirror 810 has a range of motion and moves at a constant velocity over a portion of this range. The transmission of semiconductor wafer 420 as a function of wavelength can be determined as discussed previously in reference to FIG. 9. The thickness of semiconductor wafer 420 may then be determined as discussed in reference to FIG. 8.

Figure 11:
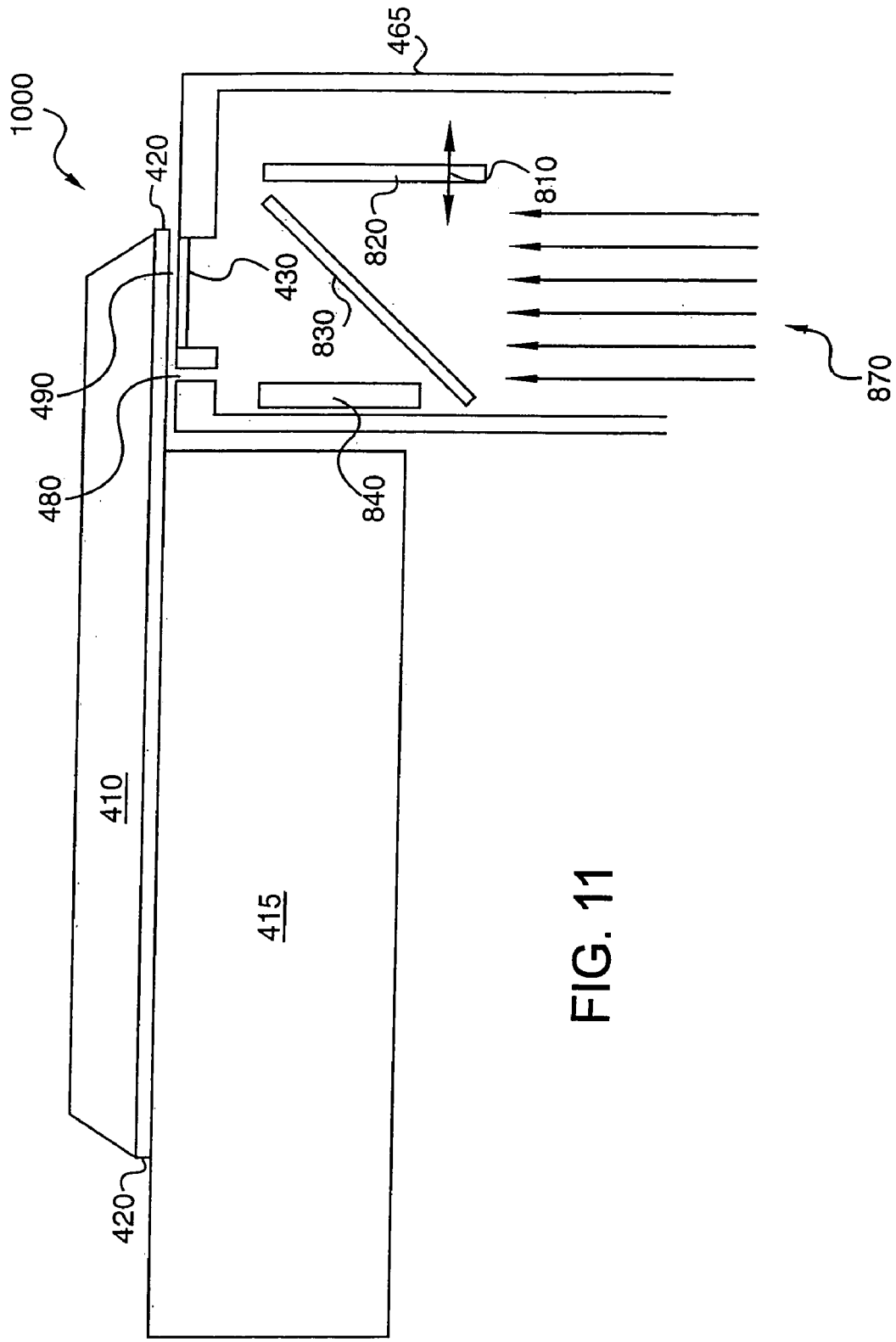
FIG. 11 illustrates a preferred apparatus for thinning a semiconductor wafer that measures light reflected by a semiconductor wafer as a function of wavelength.

In FIG. 11, another backside grinding apparatus that uses the principle of FIG. 9 is shown. Backside grinding apparatus 1000 in this example uses the reflectivity of semiconductor wafer 420 and its wavelength filtering properties to determine the thickness of the wafer. In this embodiment, multiple wavelength infrared light 870 illuminates splitter 830, which then splits the light to illuminate movable mirror 820, non-segmented detector 840, and a semiconductor wafer 420 after passing through IR window 430. Movable mirror 820 moves in a relatively short path along axis 810. The range of motion of movable mirror 820 may be improved by making housing 465 larger. The reflection from semiconductor wafer 420 as a function of wavelength can be determined as discussed previously in reference to FIG. 9. The thickness of semiconductor wafer 420 may then be determined as discussed in reference to FIG. 6.

Figure 12:
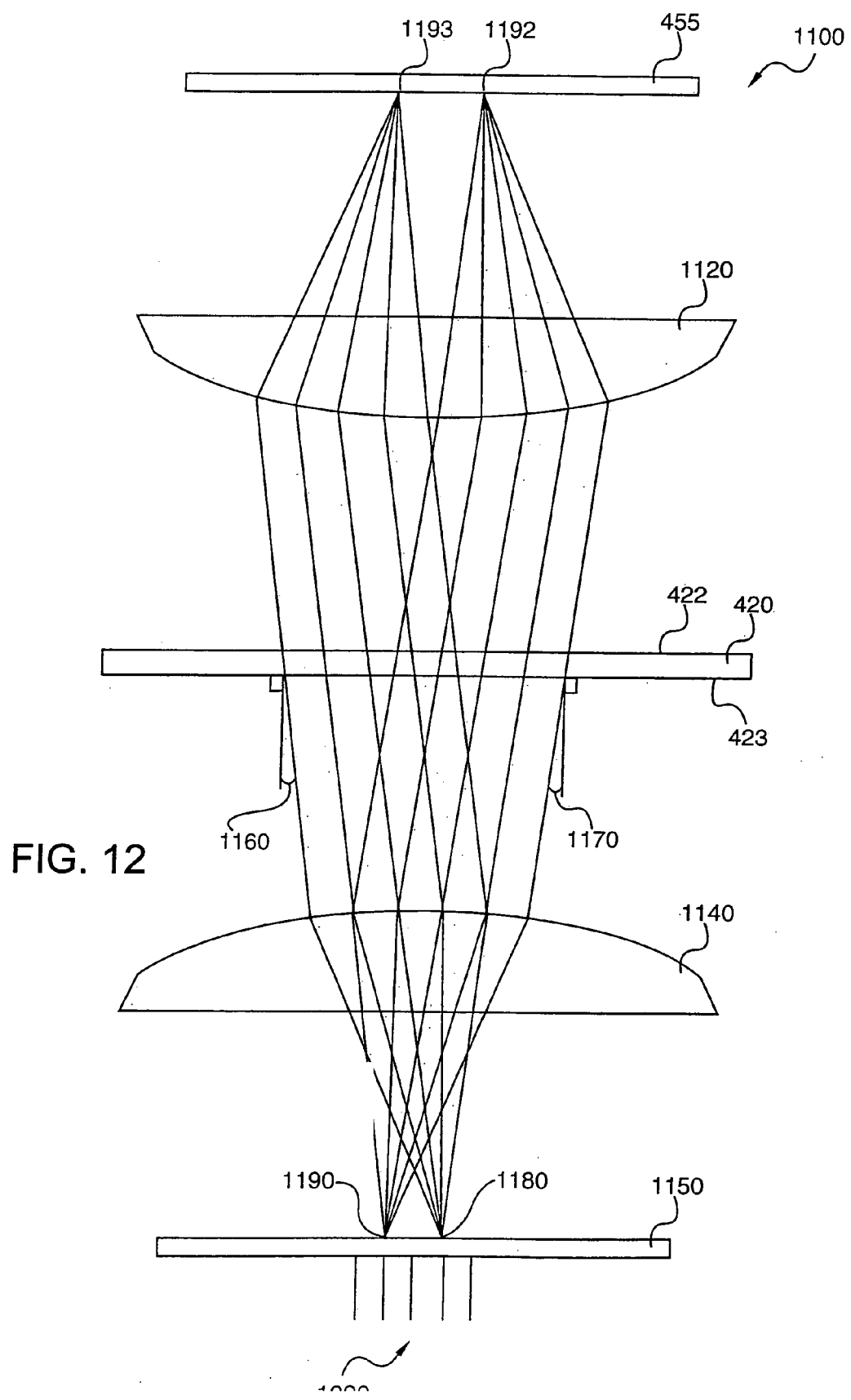
FIG. 12 is an illustration of the principles of operation for one preferred embodiment of the present invention.

Referring now to FIG. 12, this figure shows one principle of operation used when determining reflectivity or transmission as a function of angle of incidence. Apparatus 1100 comprises a diffuser 1150, two lenses 1140 and 1120 and a segmented detector 455. Between lenses 1140 and 1120 is a portion of semiconductor wafer 420. In this example, there are no process films on the portion of semiconductor wafer 420 that light passes through. Light 1220 is preferable one wavelength of an infrared light source. An infrared laser preferably produces light 1220.

Two rays are traced in FIG. 12. The first ray passes through the diffuser 1150 and is diffused into an expanding cone of light, at point 1180. Diffuser 1150 is any element that can create an expanding cone of light, such as a material transparent in the infrared whose surface has been slightly roughened to diffuse the light passing through. Only a portion of the expanding cone of light is shown in FIG. 12. Lens 1140 collimates this first ray, and the first ray strikes semiconductor wafer 420 at angle 1160. Lens 1120 focuses this ray on segmented detector 455, at point 1193. Similarly, a second ray passes through the diffuser 1150 and is diffused into an expanding cone of light, at point 1190. Only a portion of the expanding cone of light is shown in FIG. 12. Lens 1140 collimates this first ray, and the first ray strikes semiconductor wafer 420 at angle 1170. Lens 1120 focuses this ray on segmented detector 455, at point 1192.

Each point (such as points 1190 and 1180) on diffuser 1150 will correspond to a single point (such as points 1193 and 1192) on segmented detector 455. For instance, in this example point 1180 corresponds to point 1193, while point 1190 corresponds to point 1192. There will be a very large number of points and rays extending from those points. The space between each two points is not necessarily the same. For example, the space between points 1190 and 1180 is not necessarily the same as the space between points 1193 and 1192. The distance between points on the segmented detector 455 is determined by the optics in the example of FIG. 12.

Semiconductor wafer 420 acts as a filter to filter out, either completely or partially, rays having certain angles of incidence on its surface 423, while semiconductor wafer 420 will let other rays pass through. For instance, in FIG. 12, the light emitted from point 1180 might be partially blocked or absorbed, while the light emitted from point 1190 might pass with minor power degradation. The segmented detector 455 will output a multiplicity of electrical signals, each electrical signal proportionate to the amount of IR light received by a segment of the segmented detector. Because each segment will receive light from one or a few angles of incidence, a reflectivity or transmission as a function of angle of incidence graph may be made. Using this data, the semiconductor wafer's thickness can be determined.

Figure 13:
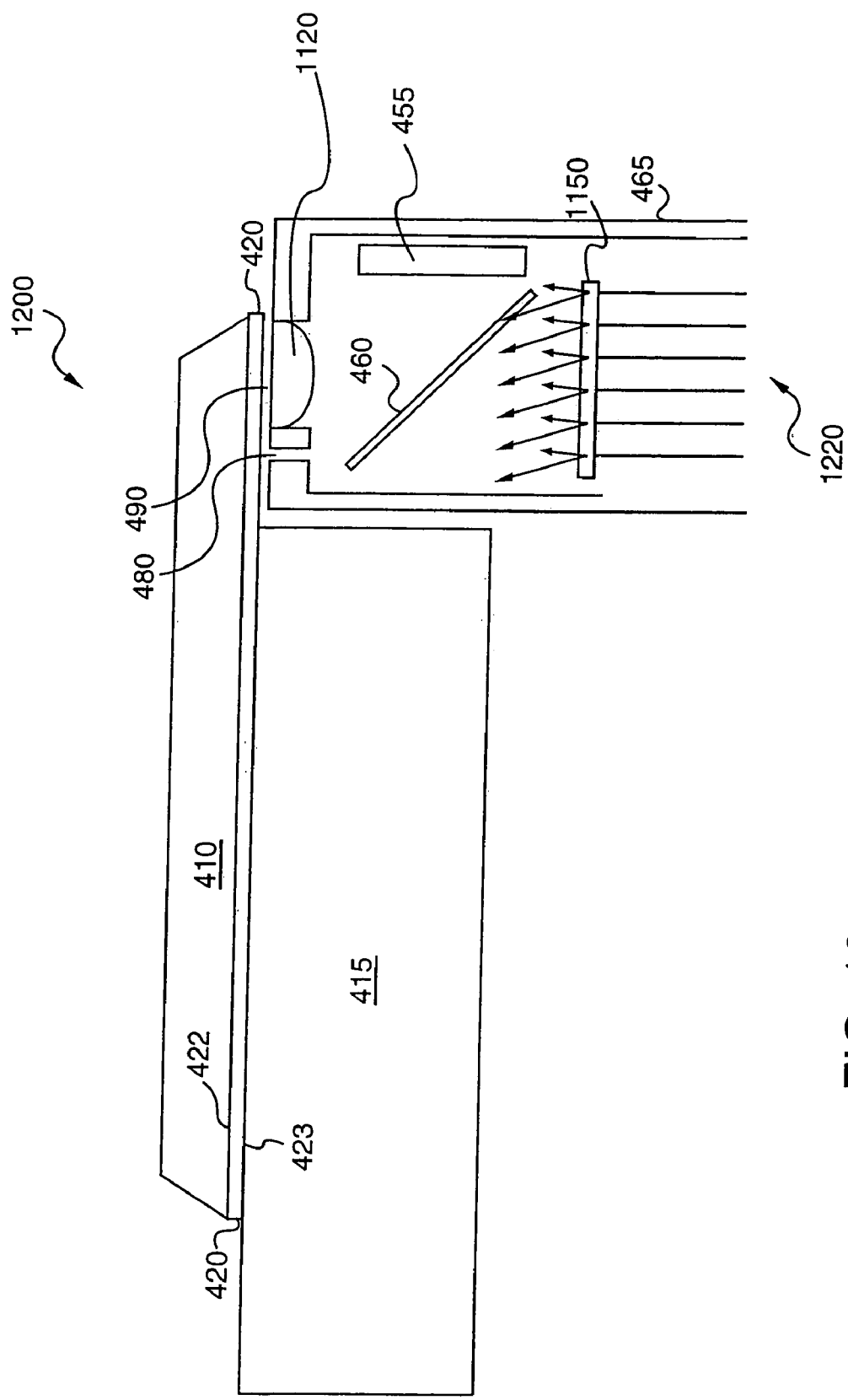
FIG. 13 illustrates a preferred apparatus for thinning a semiconductor wafer that measures light reflected by a semiconductor wafer as a function of angle of incidence.

Turning now to FIG. 13, a backside grinding apparatus 1200 that uses the principle of FIG. 12 is shown. Backside grinding apparatus 1200 comprises a backing plate 410, a grinding wheel 415, a lens 1120, a splitter 460, a diffuser 1150, a segmented detector 455, and a housing 465. Single wavelength light 1220 illuminates splitter 460, which directs light to the lens 1120 and to the segmented detector 455. Lens 1120 collimates and projects the light onto semiconductor wafer 420. Lens 1120 then focuses the reflected light from the semiconductor wafer onto detector 455, after reflection from splitter 460.

Light reflected from the semiconductor wafer's topside 422 and backside 423 will partially reflect from splitter 460 to segmented detector 455 (some light will also pass, to then illuminate diffuser 1150). Each segment of the segmented detector will receive light from one or a few points of the diffuser 1150. Because each point on the diffuser corresponds to an angle of incidence to the semiconductor wafer's backside 423, each segment of the segmented detector 455 will receive light corresponding to one or a few angles of incidence. A reflectivity of the semiconductor wafer as a function of angle of incidence graph may then be determined.

Note that lens 1120 may be replaced by an IR window, as long as the IR light striking segmented detector 455 is focused before the light strikes the detector. Focusing the light is important, as focusing the light separates the different light rays into their corresponding angles of incidence. If the light is not focused, then each portion of the segmented detector will receive light rays from many angles of incidence. This will create an invalid angle of incidence measurement.

Figure 14:
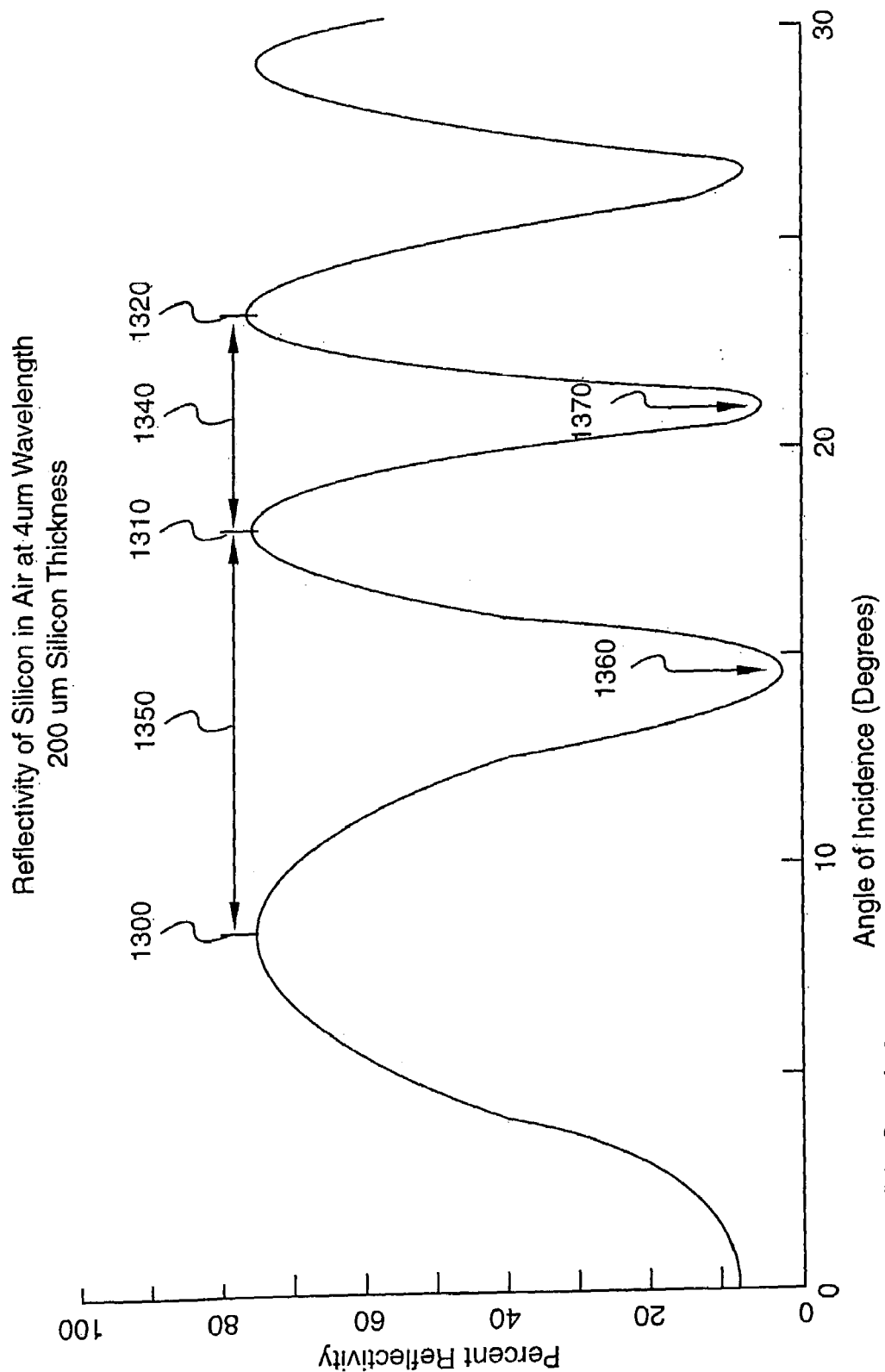
FIG. 14 illustrates an example of reflectivity of light reflected by a semiconductor wafer as measured by the preferred apparatus of FIG. 13.

In FIG. 14, an example of reflectivity as a function of angle of incidence graph is shown. This is a theoretical graph of the percent reflectivity (the amount of light that impinges the detector divided by the amount of light output by the light source) as a function of angle of incidence for a semiconductor wafer that is 200 microns thick and for IR light with a wavelength of 4.0 microns. Peaks 1300, 1310, and 1320 are created because the semiconductor wafer lets these angles of incidence pass, while troughs 1360 and 1370 are created because semiconductor wafer 420 reflects or destructively interferes with these angles of incidence.

Unlike in FIGS. 6 and 8, distances 1350 and 1340 are not the same approximate distance. Similarly, the distance between troughs will also change as a function of angle of incidence. Because of this, the best method for determining the thickness of the semiconductor is through a curve fitting technique. In this embodiment, currently measured data are compared to either mathematically determined data or empirically predetermined data for various thicknesses of a semiconductor wafer. Interpolation can be used, if necessary, to provide more accurate thicknesses if the currently measured data falls between two determined curves. As stated above, the mathematically determined data may be calculated in real time or stored for retrieval.

The best curve fitting techniques to use will be those techniques that attempt to match the location of the troughs and peaks and not necessarily the percent reflectivity of the troughs or peaks. This is true because roughness of the backside of the wafer will tend to lower the dynamic range of the reflectivity (and transmission) curve, but the wavelengths at which the peaks and troughs occur should remain relatively constant for a particular semiconductor wafer thickness. This is discussed in reference to FIGS. 17 and 18.

Again, as with the previous reflectivity or transmission versus wavelength graphs, the phase of this curve (and the transmission versus angle of incidence curve) changes with semiconductor wavelength thickness. In other words, as the semiconductor wafer is ground, the curve shown in FIG. 14 will shift to the right and the peaks will move farther apart. Because of this movement of the peaks and the curve, an alternate analysis technique for determining semiconductor wafer thickness would be to determine, for a variety of thicknesses of the semiconductor wafer, where peaks 1300, 1310, and 1320 should be for each thickness. Then, a lookup table could be used to determine the thickness of the semiconductor wafer. For example, if peak 1300 is measured as shown in FIG. 14 (about 7.5 degrees), and peaks 1310 and 1320 are about 17.5 and 23.0 degrees, respectively, then the semiconductor wafer's thickness is 200 microns. If peak 1300 is measured as shown in FIG. 14, but peaks 1310 and 1320 are measured at (for example) 15.5 and 19.0 degrees, respectively, then the semiconductor wafer will be a different thickness.

Figure 15:
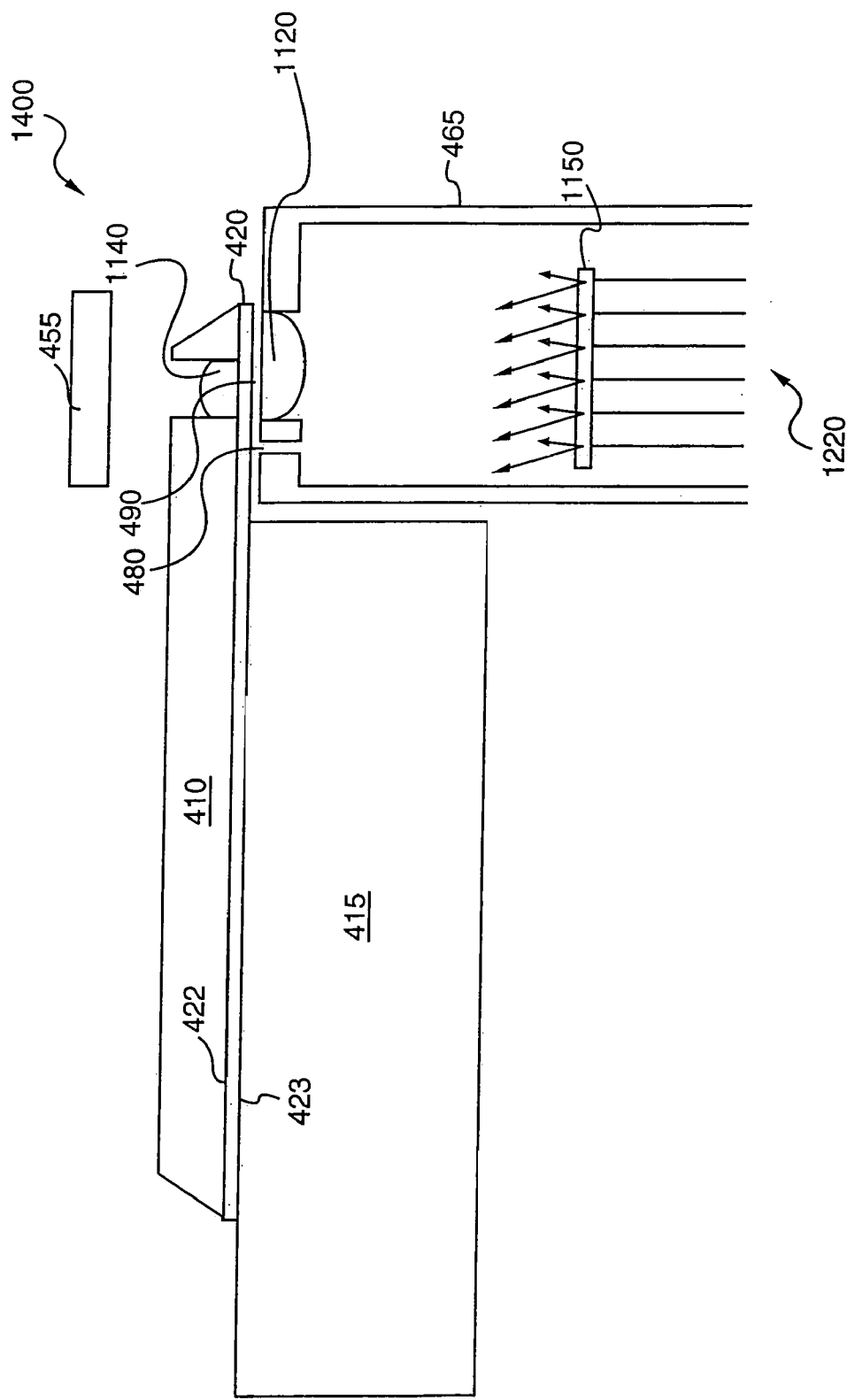
FIG. 15 illustrates a preferred apparatus for thinning a semiconductor wafer that measures light transmitted through a semiconductor wafer as a function of angle of incidence.

Turning now to FIG. 15, a backside grinding apparatus 1400 is shown that uses the principle of FIG. 12. Backside grinding apparatus 1400 comprises a backing plate 410, a grinding wheel 415, lenses 1120 and 1140, a diffuser 1150, a segmented detector 455, and a housing 465. Single wavelength light 1220 illuminates lens 1120, which collimates the light onto semiconductor wafer 420. Light transmits through semiconductor wafer 420 and is focused by IR lens 1140 onto segmented detector 455. Note that, in this embodiment, lens 1120 may be replaced by an IR window, as lens 1140 performs the critical focusing function. Light from one or a few angles of incidence impinges each segment of the segmented detector 455. Electrical signals from the multitude of segments may then be used to determine a transmission as a function of angle of incidence graph.

Figure 16:
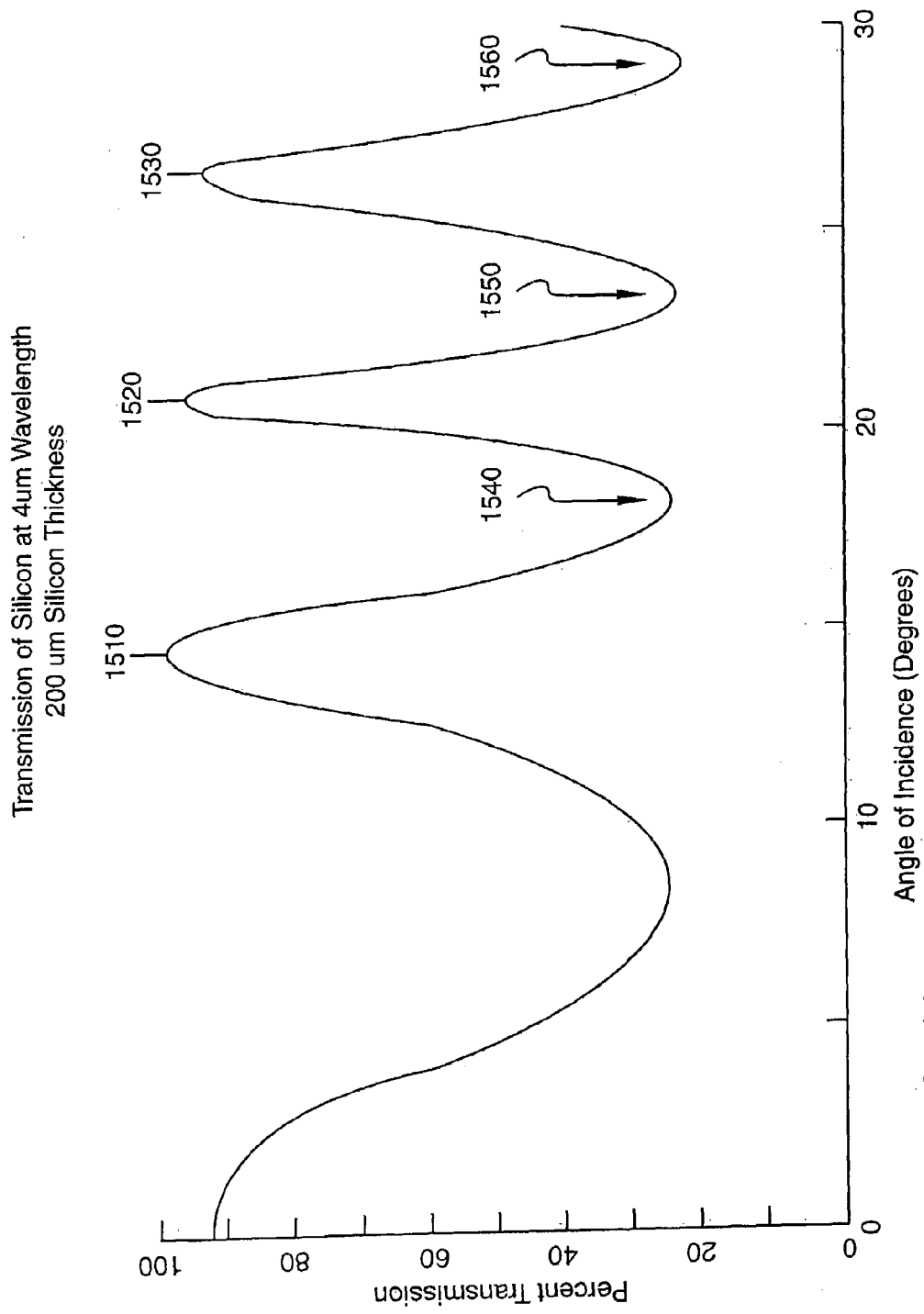
FIG. 16 illustrates an example of the transmission of light through a semiconductor wafer as measured by the preferred apparatus of FIG. 15.

Such a graph is shown in FIG. 16. This is a mathematically determined graph of the transmission of a semiconductor wafer as a function of angle of incidence for a 200 micron thick semiconductor wafer, measured with IR light at 4.0 microns. As in FIG. 14, peaks 1510, 1520 and 1530 and troughs 1540, 1550, and 1560 are not evenly spaced in terms of angle of incidence. Because of this, the preferred method of determining the semiconductor wafer's thickness is through curve fitting. Currently measured data is compared against mathematically or empirically determined data. To determine the semiconductor wafer thickness, the closest curve fit between the measured and determined data is found (although interpretation may be used). The determined thickness that corresponds to the mathematically or empirically determined data will be the measured thickness.

Figure 17:
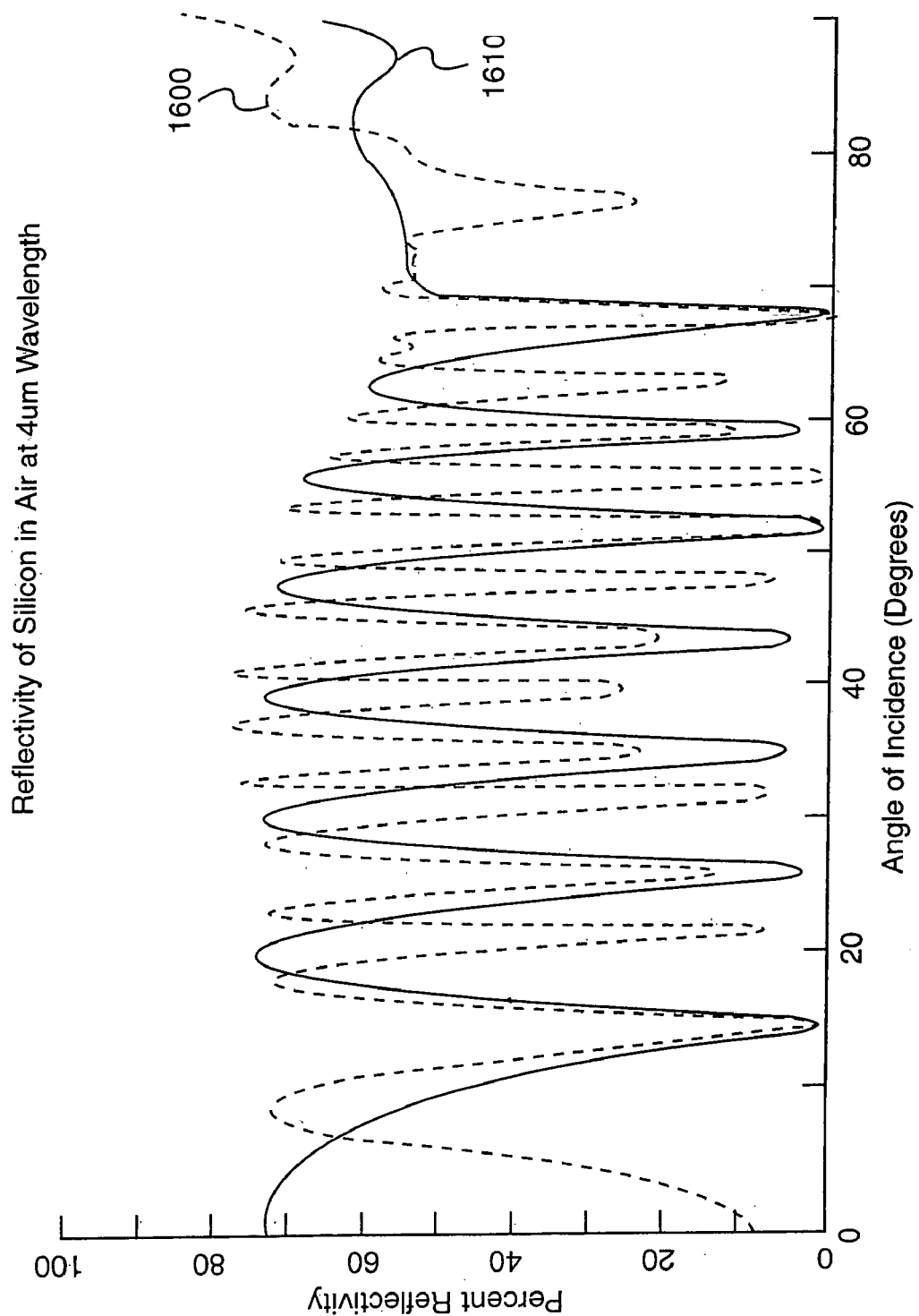
FIG. 17 is a graph of the reflectivity of silicon with no surface roughness when illuminated by a light beam having a wavelength of four microns.

Referring now to FIG. 17, the reflectivity of a semiconductor wafer is shown. The curves in FIG. 17 are mathematically determined. Line 1610 shows the reflectivity for a 100 micron thick semiconductor wafer with a smooth backside. Line 1600 shows the reflectivity for a 200 micron thick semiconductor wafer with a smooth backside. Thicker semiconductor wafers tend to create more peaks that are spaced closer together, while thinner semiconductor wafers create fewer peaks that are spaced farther apart.

Figure 18:
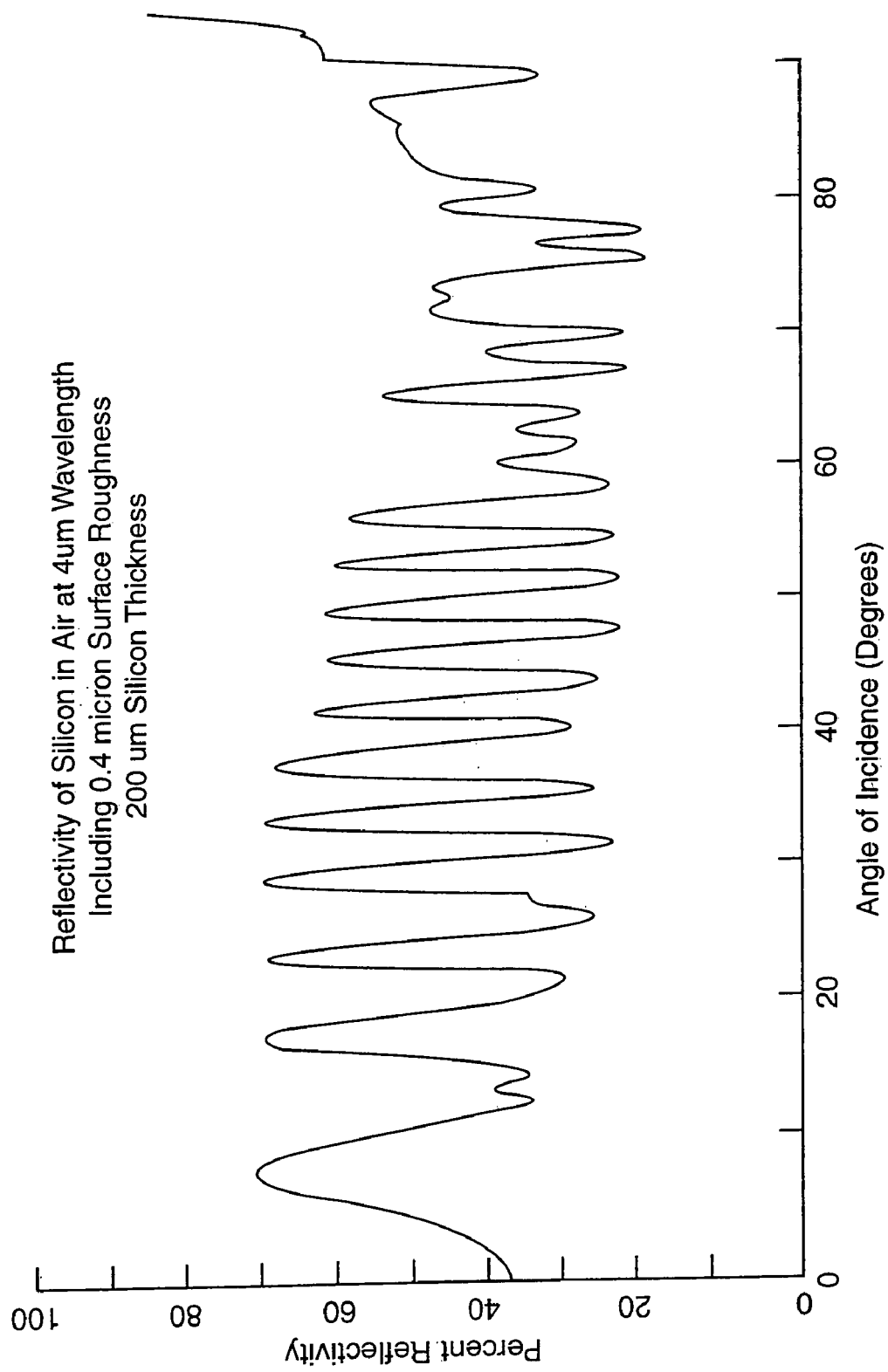
FIG. 18 is a graph of the reflectivity of silicon with 0.4 microns surface roughness when illuminated by a light beam having a wavelength of four microns.

Turning now to FIG. 18, this figure illustrates the effects of surface roughness on an angle of incidence measurement. Roughness will also cause similar effects to wavelength measurements. FIG. 18 is a mathematically determined graph of the reflectivity of a semiconductor wafer of 200 microns thickness but having 0.4 micron surface roughness. The 0.4 micron surface roughness is the roughness that is expected after the backside grinding process is finished. To determine FIG. 18, four reflectivity versus angle of incidence curves were created at 200.0, 200.1, 200.2, 200.3, and 200.4 microns. These curves were added together to produce FIG. 18. FIG. 18 illustrates that the dynamic range (the vertical distance, in percent reflectivity, between peaks and troughs) is reduced. However, the peaks and troughs still remain at very nearly the same horizontal, angle of incidence, position. Thus, even though the dynamic range is reduced, a curve fitting technique that does not rely on fitting the entire dynamic range but relies on fitting the location of peaks and troughs will still be able to determine the semiconductor wafer thickness with high accuracy.

Figure 19:
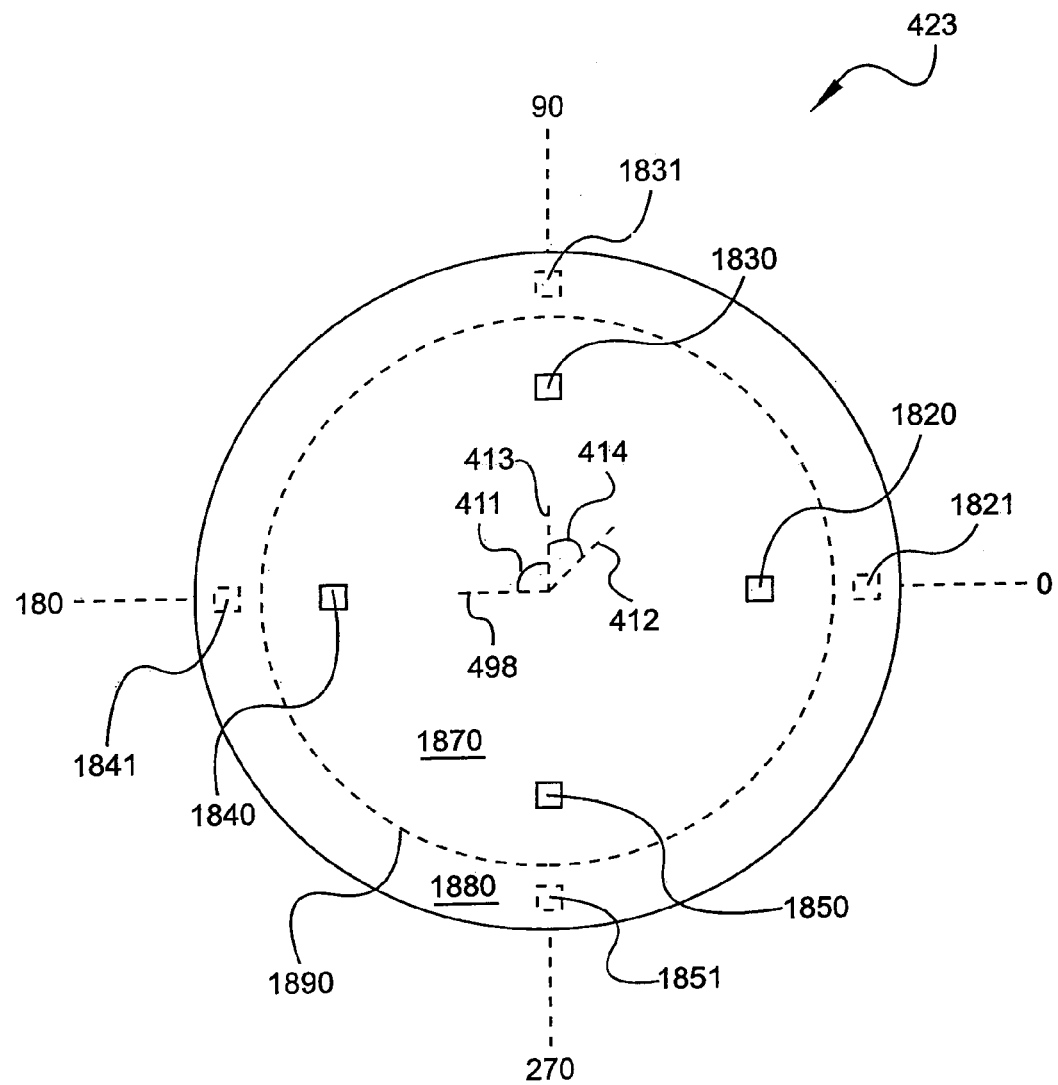
FIG. 19 is a view of the backside of a semiconductor wafer, with preferred locations for determining wafer thicknesses.

Referring now to FIG. 19, the backside surface 423 of a semiconductor wafer is shown. This figure shows example thickness determination areas that may be used to determine wedging. Semiconductor wafer 420 is divided by imaginary line 1890 into a chip area 1870 having deposited process films and a clean area 1880 that does not have deposited process films. It should be noted that deposited process films are deposited on topside surface 422 (not shown) and not a backside surface 423. Locations 1820, 1830, 1840, and 1850 are preferably windows if the transmission measuring embodiments of the present invention are used, or are locations where measurements will be made if the reflection embodiments of the present invention are used. For both transmission and reflection measurements, it is recommended that windows, where no process films are deposited, be created in the semiconductor wafer. This will prevent deposited process films from interfering with the analyses of the present invention. Locations 1821, 1831, 1841, and 1851 are areas where thickness determinations can be made.

By determining the thickness of the semiconductor wafer in more than one circumferential location, wedging information may be determined. If two locations are used, there could be no difference in thickness measurements at these two locations, but there still could be wedging. For instance, if thickness measurements 1820 and 1840 are used to determine the amount of wedging, there may not be any measured thickness difference or only a small amount of measured thickness difference between the two locations. However, there could be wedging along axis 498 that measurements at 1820 and 1840 would not catch. If four locations are used, then wedging along axes 413 and 498 should be easily determined: if the difference between any two of these locations is greater than a predetermined thickness, then the grinding wheel can be made to adjust to reduce wedging. The most preferred embodiment is that an alarm or other indicia be generated when wedging is found. This allows workers to be alerted to the wedging problem and allows the workers to determine and correct the source of the wedging.

Referring to FIGS. 5 and 19, to provide an angular determination of where the thickness measurement is being made, it is preferred that backing plate 410 have an angular sensor. Using the angular sensor allows the angular location of the semiconductor wafer to be determined. For example, in FIG. 19, locations 1820 and 1821 are at zero degrees, locations 1830 and 1831 are at 90 degrees, locations 1840 and 1841 are at 180 degrees, and locations 1850 and 1851 are at 270 degrees. With angular data such as this, an x,y,z (or simply x,y or r, theta, phi) coordinate system may be used to determine the amount of wedging and to provide leveling information to a control apparatus (not shown) that controls the position of the grinding wheel.

Although reference to graphing is made herein, in reality currently measured data will be compared to mathematically derived or empirically measured data to determine semiconductor wafer thickness, or the measured data will be used in formulas to derive the thickness. There is no requirement to "graph" data with the current invention; graphs are used herein to help the explanation of the preferred embodiments.

The foregoing description of the present invention has been presented for purposes of illustration and description. It is not intended to be exhaustive or to limit the invention to the precise form disclosed, and many modifications and variations are possible in light of the above teaching. Such modifications and variations that may be apparent to a person skilled in the art are intended to be included within the scope of this invention as defined by the accompanying claims. For example, although silicon semiconductor wafers have been discussed herein, the invention is equally applicable to other semiconductor wafer material, such as gallium arsenide, if an appropriate light source and equations are used. Moreover, dispersing, collimating, diffusing and focusing light may be performed at a number of different locations before and/or after light impinges and/or is reflected by or transmitted through the semiconductor wafer; the embodiments claimed and discussed herein are merely representative and other versions are possible. Additionally, all apparati are shown illuminating the backside of the semiconductor wafer; these apparati could easily be modified to illuminate the topside of the wafer.

We claim:

1. An apparatus for thinning a semiconductor wafer, comprising:
    a system for removing a portion of a backside of the semiconductor wafer; and
    an optical system for measuring a thickness of the semiconductor wafer at a plurality of locations on the semiconductor wafer, wherein the optical system comprises a single wavelength light source positioned to illuminate a surface of the semiconductor wafer, wherein the optical system further comprises a segmented detector and a lens, and wherein the lens is positioned to direct light onto the segmented detector; and
    a control system for halting the system for removing when the measured thickness of the semiconductor wafer reaches a predetermined thickness.

2. The apparatus of claim 1, further comprising a diffuser positioned between the single wavelength light source and the semiconductor wafer.

3. An apparatus for thinning a semiconductor wafer, comprising:
    a system for removing a portion of a backside of the semiconductor wafer, wherein the system for removing comprises a chuck to which the semiconductor wafer is attached;
    an optical system for measuring a thickness of the semiconductor wafer at a plurality of locations on the semiconductor wafer, wherein the optical system comprises a single wavelength light source positioned to illuminate a surface of the semiconductor wafer, wherein the optical system further comprises a segmented detector and a lens, wherein the lens is positioned to direct light onto the segmented detector, and wherein the chuck has a passage that is periodically positioned to allow light, emitted from the single wavelength light source, that passes through the semiconductor wafer to illuminate the lens; and
    a control system for halting the system for removing when the measured thickness of the semiconductor wafer reaches a predetermined thickness.

4. The apparatus of claim 1, wherein the segmented detector is adapted to output a multiplicity of electrical signals, and wherein each electrical signal is proportional to an amount of light received from the single wavelength light source by a corresponding segment of the segmented detector.

5. The apparatus of claim 4, further comprising means for measuring the thickness of the semiconductor wafer from analysis of the multiplicity of electrical signals.

6. An apparatus for thinning a semiconductor wafer, comprising:
    a system for removing a portion of a backside of the semiconductor wafer;
    an optical system for measuring a thickness of the semiconductor wafer at a plurality of locations on the semiconductor wafer, wherein the optical system comprises a single wavelength light source positioned to illuminate a surface of the semiconductor wafer;
    a control system for halting the system for removing when the measured thickness of the semiconductor wafer reaches a predetermined thickness; and
    a diffuser positioned between the single wavelength light source and the semiconductor wafer, wherein the optical system further comprises a splitter positioned between the diffuser and the semiconductor wafer, wherein the diffuser is positioned to direct light onto the splitter.

7. The apparatus of claim 6, wherein the splitter is further positioned to direct light onto the surface of the semiconductor wafer.

8. An apparatus for thinning a semiconductor wafer, comprising:
    a system for removing a portion of a backside of the semiconductor wafer;
    an optical system for measuring a thickness of the semiconductor wafer at a plurality of locations on the semiconductor wafer, wherein the optical system comprises a single wavelength light source positioned to illuminate a surface of the semiconductor wafer;

a control system for halting the system for removing when the measured thickness of the semiconductor wafer reaches a predetermined thickness; and a diffuser positioned between the single wavelength light source and the semiconductor wafer, wherein the system for removing comprises a chuck to which the semiconductor wafer is attached and wherein the optical system further comprises a lens, wherein the chuck has a passage that is periodically positioned to allow light, emitted from the single wavelength light source, that passes through the semiconductor wafer to illuminate the lens.

* * * * *